(12) United States Patent
Kim et al.

(10) Patent No.: US 8,975,692 B2
(45) Date of Patent: Mar. 10, 2015

(54) SEMICONDUCTOR DEVICE AND METHOD OF FABRICATING THE SAME

(71) Applicant: Electronics and Telecommunications Research Institute, Daejeon (KR)

(72) Inventors: Sang Gi Kim, Daejeon (KR); Jin-Gun Koo, Daejeon (KR); Seong Wook Yoo, Daegu (KR); Jong-Moon Park, Daejeon (KR); Jin Ho Lee, Daejeon (KR); Kyoung Il Na, Busan (KR); Yil Suk Yang, Daejeon (KR); Jongdae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 14/100,780

(22) Filed: Dec. 9, 2013

(65) Prior Publication Data

US 2014/0091388 A1    Apr. 3, 2014

Related U.S. Application Data

(62) Division of application No. 13/228,479, filed on Sep. 9, 2011, now Pat. No. 8,629,020.

(30) Foreign Application Priority Data

Oct. 25, 2010 (KR) ........................ 10-2010-0103907
Dec. 8, 2010 (KR) ........................ 10-2010-0125025

(51) Int. Cl.
*H01L 29/76* (2006.01)
*H01L 29/78* (2006.01)
*H01L 21/225* (2006.01)

(Continued)

(52) U.S. Cl.
CPC ........ *H01L 29/7813* (2013.01); *H01L 21/2255* (2013.01); *H01L 29/0634* (2013.01); *H01L 29/1095* (2013.01); *H01L 29/66727* (2013.01);

(Continued)

(58) Field of Classification Search
USPC ............................................ 257/337, E29.26
See application file for complete search history.

(56) References Cited

U.S. PATENT DOCUMENTS 4,767,722 A    8/1988    Blanchard
5,442,214 A    8/1995    Yang (Continued)

FOREIGN PATENT DOCUMENTS

KR    10-0400079 B1    9/2003

OTHER PUBLICATIONS

C. Rochefort and R. Van Dalen. "A Scalable Trench Etch Based Process for High Voltage Vertical Resurf MOSFETs." Philips Research Leuven, Kapeldreef 75, B-3001 Leuven, Belgium. May 23-26, 2005. Santa Barbara, CA.

(Continued)

*Primary Examiner* — Chandra Chaudhari
(74) *Attorney, Agent, or Firm* — Rabin & Berdo, P.C.

(57) ABSTRACT

Provided are a semiconductor device and a method of fabricating the same. The method includes: forming a trench in a semiconductor substrate of a first conductive type; forming a trench dopant containing layer including a dopant of a second conductive type on a sidewall and a bottom surface of the trench; forming a doping region by diffusing the dopant in the trench dopant containing layer into the semiconductor substrate; and removing the trench dopant containing layer.

9 Claims, 21 Drawing Sheets

(51) Int. Cl.
*H01L 29/06* (2006.01)
*H01L 29/10* (2006.01)
*H01L 29/66* (2006.01)

(52) U.S. Cl.
CPC ...... *H01L 29/66734* (2013.01); *H01L 29/7811* (2013.01); *H01L 29/0653* (2013.01)
USPC ...................... 257/334; 257/337; 257/E29.26

(56) References Cited

U.S. PATENT DOCUMENTS

| | | | |
|---|---|---|---|
| 5,567,634 | A | 10/1996 | Hebert et al. |
| 6,376,878 | B1 * | 4/2002 | Kocon ........................... 257/335 |
| 6,852,597 | B2 | 2/2005 | Park et al. |
| 7,170,119 | B2 | 1/2007 | Yamauchi et al. |
| 7,541,244 | B2 | 6/2009 | Lin et al. |
| 7,998,808 | B2 | 8/2011 | Viswanathan et al. |
| 2003/0181010 | A1 | 9/2003 | Blanchard |

OTHER PUBLICATIONS

Daisuke Ueda, Hiroi\fiitsu Takagi, and Gota U N O. "A New Vertical Power MOSFET Structure with Extremely Reduced On-Resistance." IEEE Transkctions on Electron Devices, vol. Ed-32, No. 1, January 1985.

Daisuke Ueda, Hiromitsu Takagi, and Gota Kano. "An Ultra-Low On-Rizsistance Power MOSFET Fabricated by Using ai Fully Self-Aligned Process." IEEE Transations on Electron Devices, vol. Ed-34, No. 4, Apr. 1987.

Yoshiyuki Hattori, Kyoko Nakashima, Makoto Kuwahara, Tomoyuki Yoshida, Shoichi Yamauchi*, and Hitoshi Yamaguchi*. "Design of a 200V Super Junction MOSFET with n-buffer regions and its Fabrication by Trench Filling," Toyota Central R&D Labs., Inc., Nagakute, Aichi, 480-1192, Japan, May 2004.

* cited by examiner

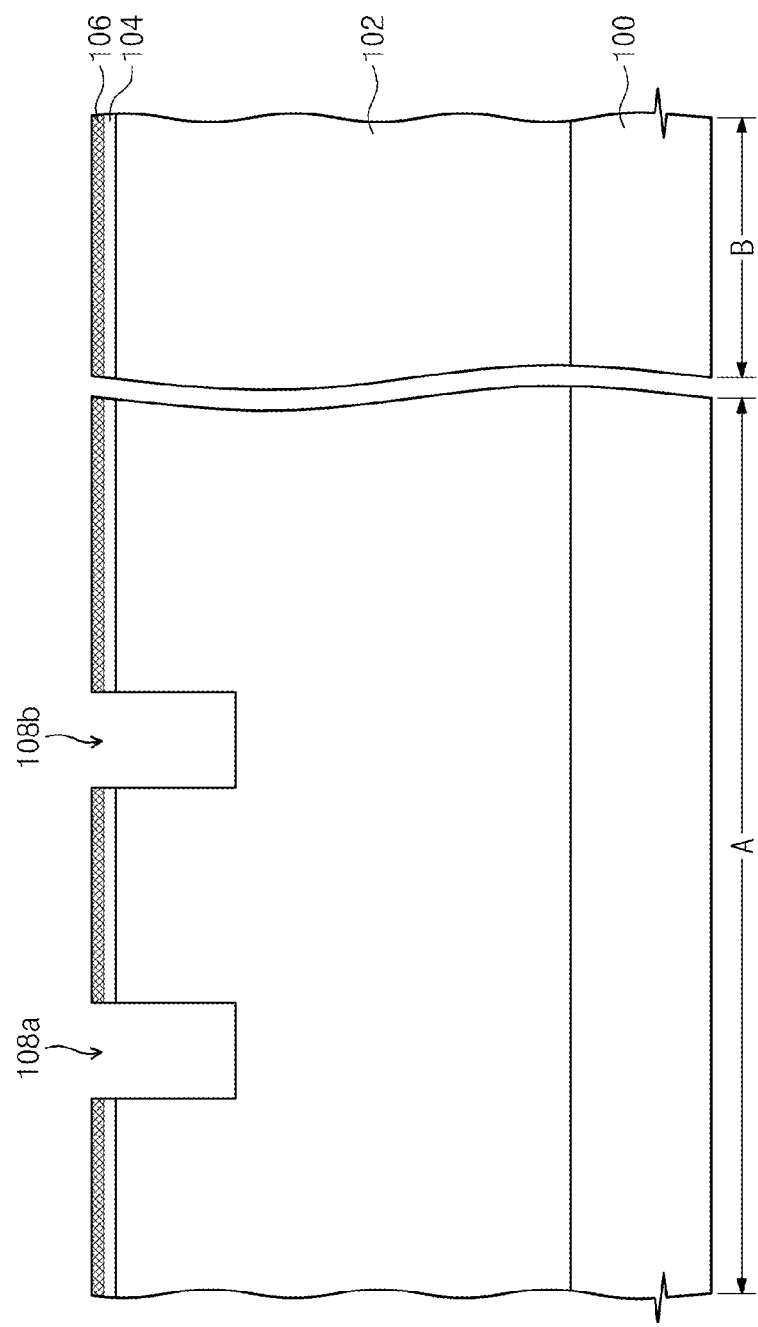

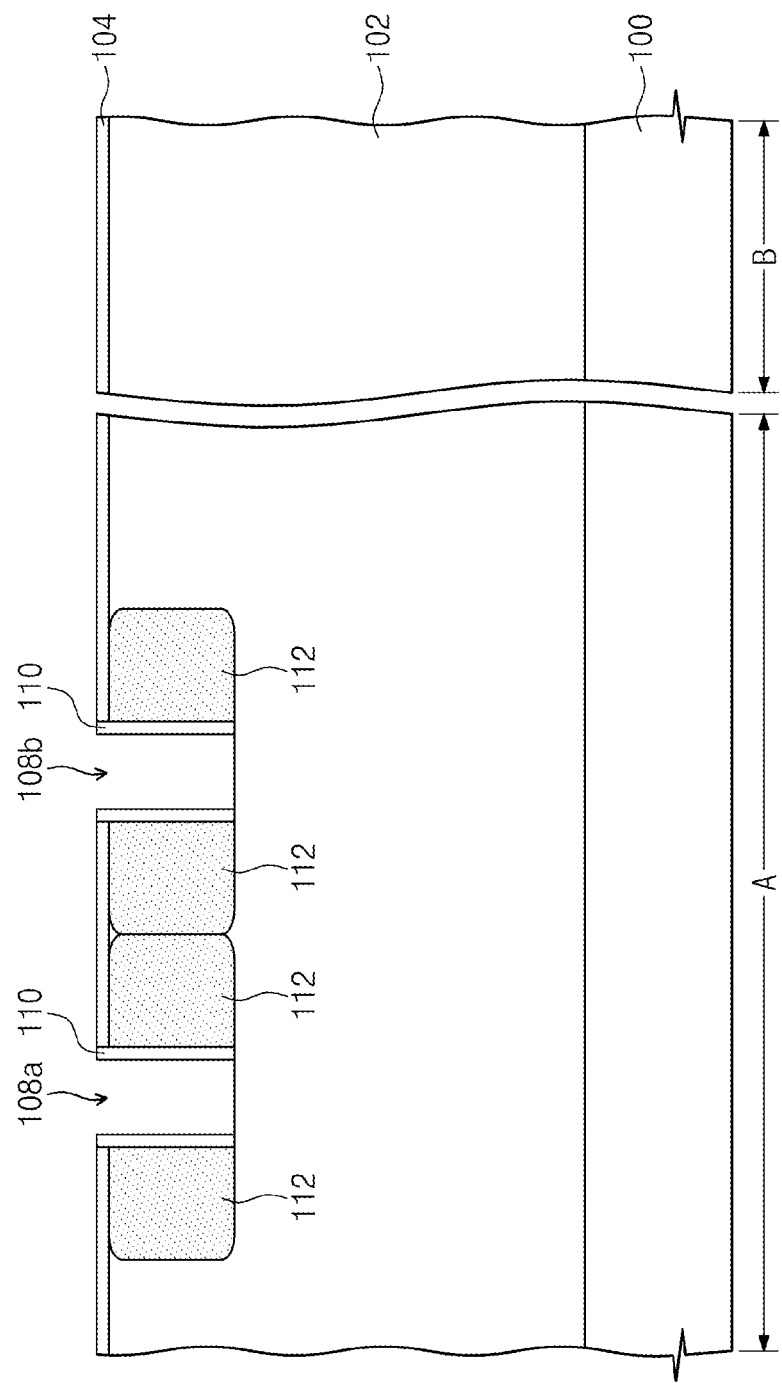

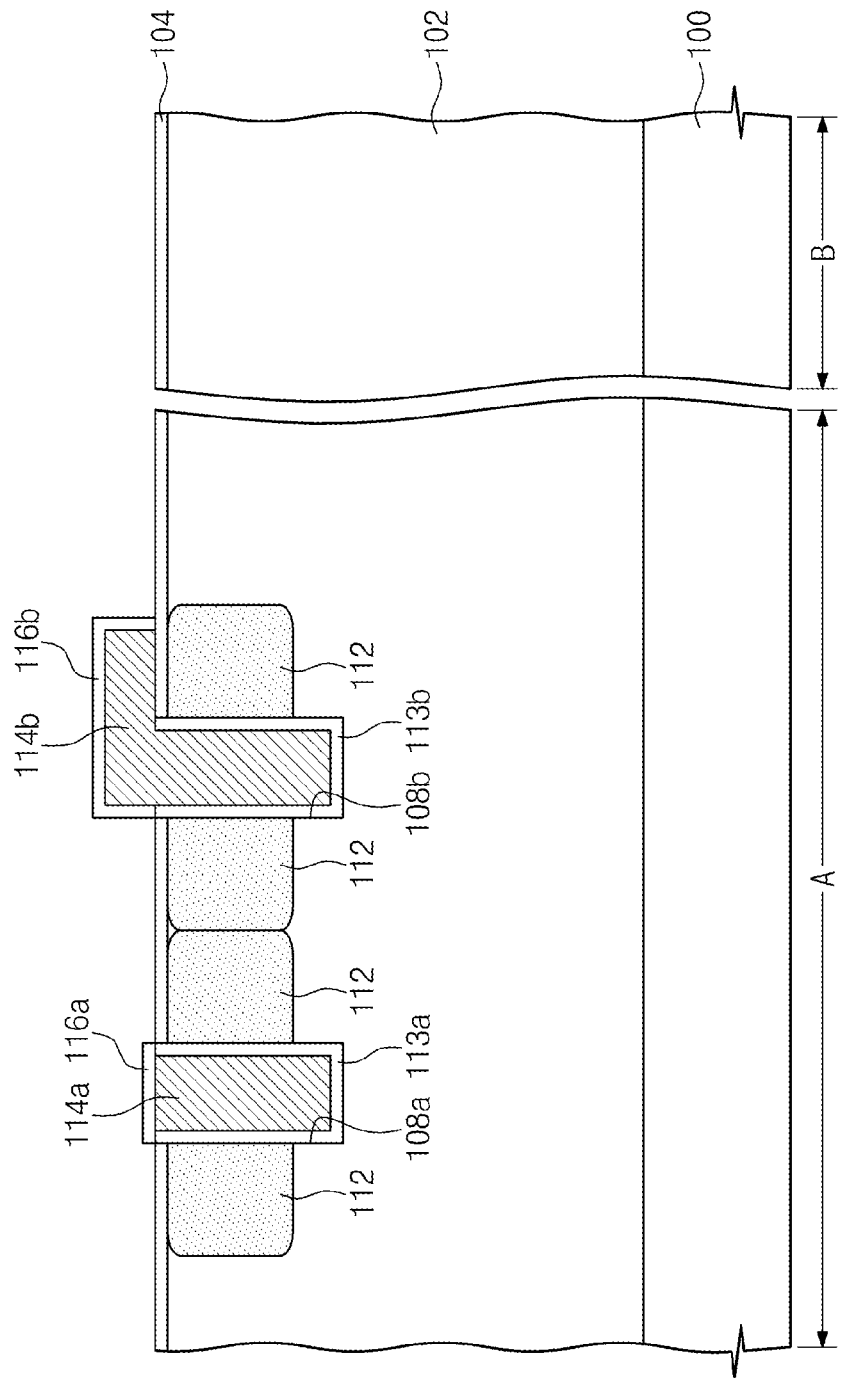

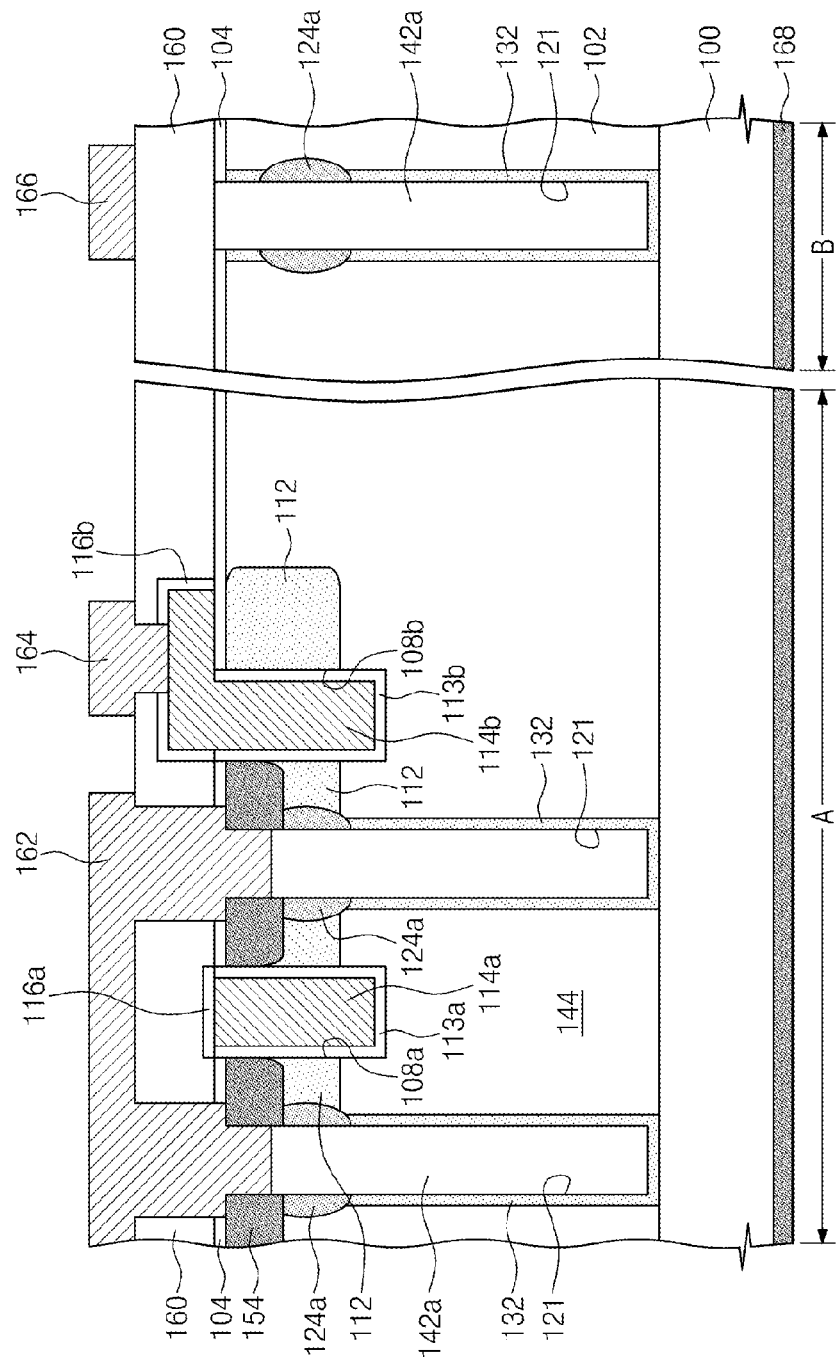

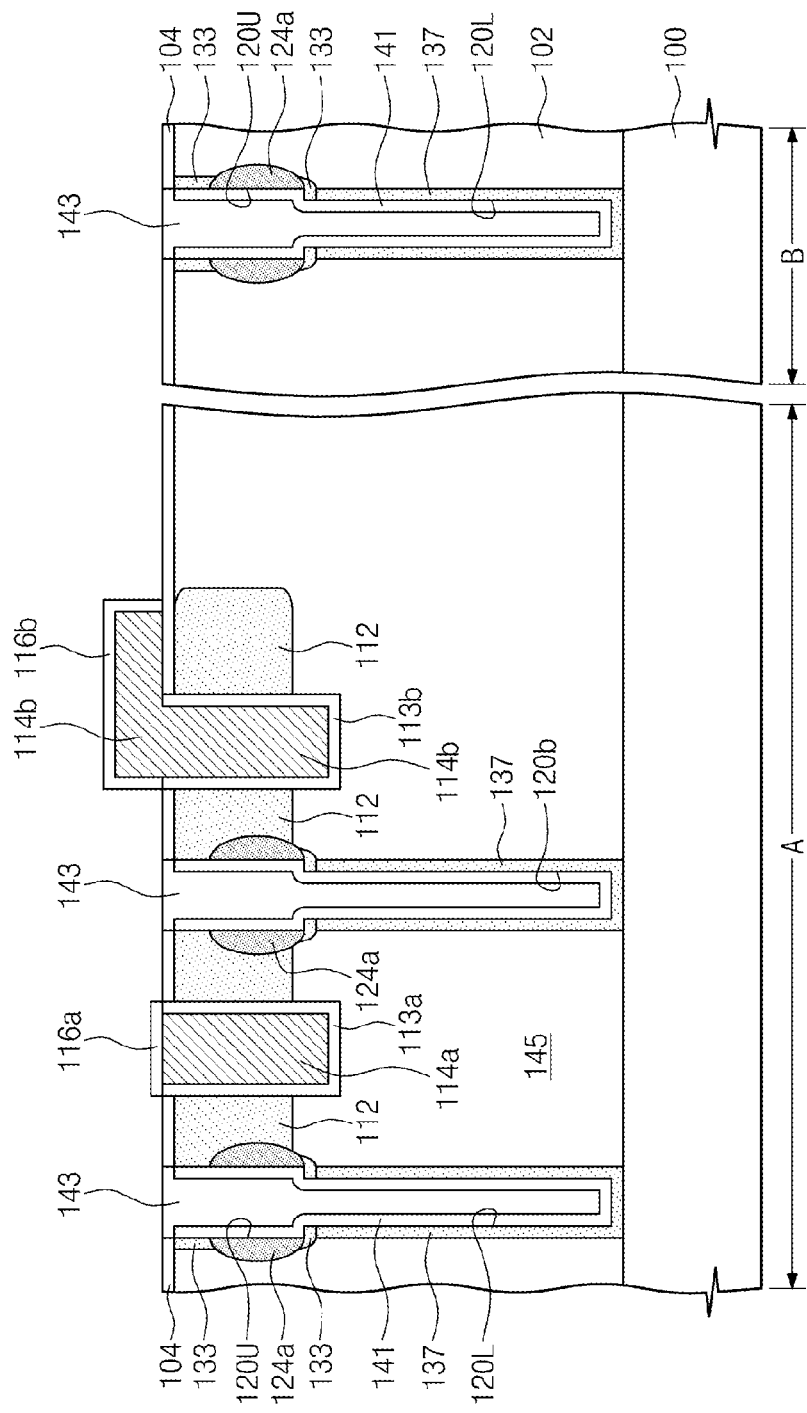

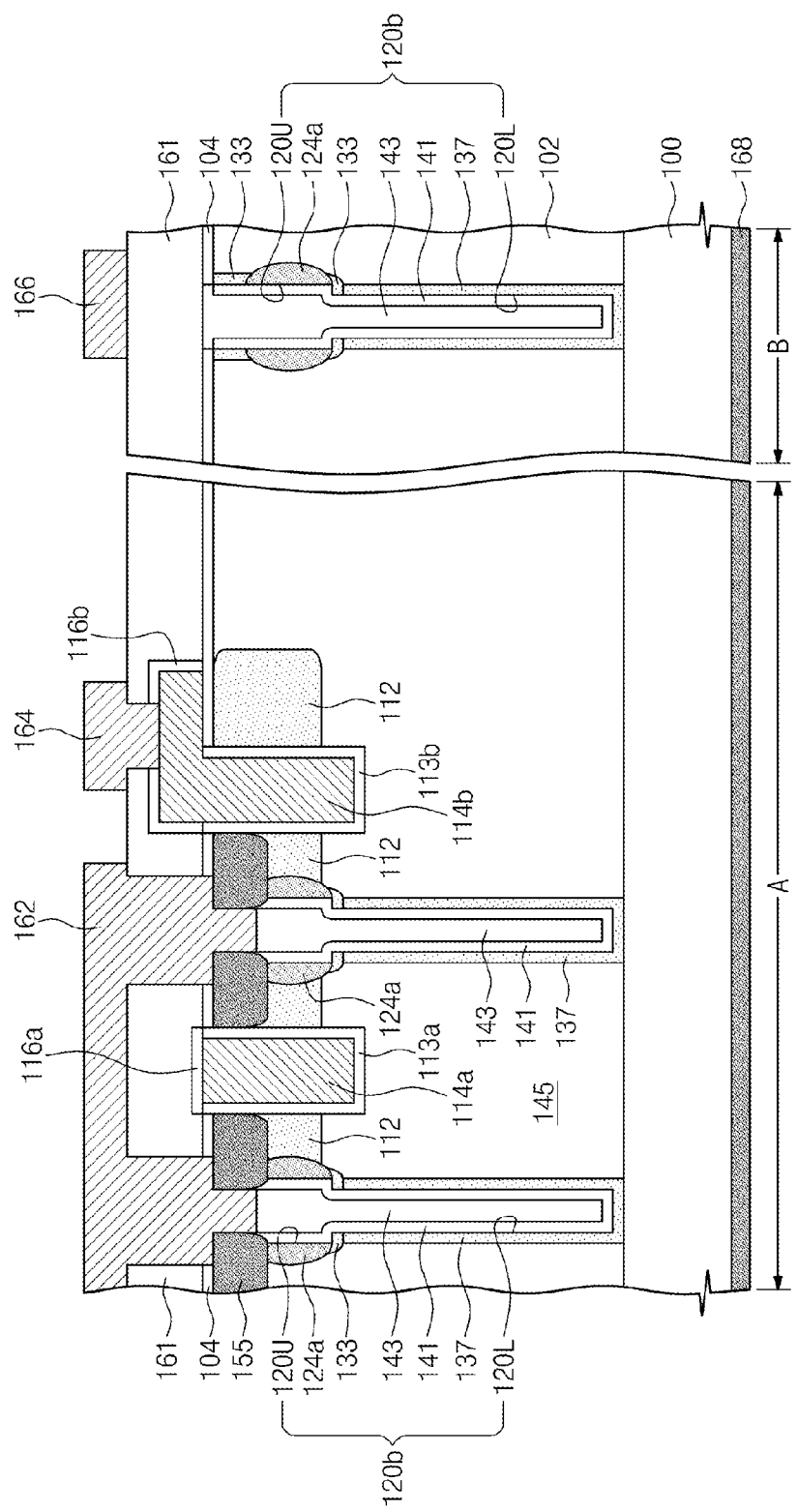

SEMICONDUCTOR DEVICE AND METHOD OF FABRICATING THE SAME

CROSS-REFERENCE TO RELATED APPLICATIONS

This application is a divisional of application Ser. No. 13/228,479, filed on Sep. 9, 2011. Further, this application claims priority of Korean Patent Application Nos. 10-2010-0103907, filed on Oct. 25, 2010, and 10-2010-0125025, filed on Dec. 8, 2010. The disclosure of these prior U.S. and Korean applications are incorporated herein by reference.

BACKGROUND OF THE INVENTION

The present invention disclosed herein relates to a semiconductor device and a method of fabricating the same.

A semiconductor device in a variety of electronic devices including home appliances is an important component for determining their qualities. As high capacity, multi-function and/or miniaturization of electronic devices tend to be more required, demands on a semiconductor device with improved reliability and other characteristics is being increased. To satisfy these demands, various techniques are introduced to improve characteristics of the semiconductor device.

A Double Diffused Metal Oxide Semiconductor Field Effect Transistor (DMOS) is one kind of a semiconductor device and refers to a Metal Oxide Semiconductor Field Effect Transistor (MOSFET) type using diffusion to form a transistor region and is typically used as a power transistor for a high voltage power integrated circuit. The DMOS is a power transistor having a high-speed switching ability in a low gate voltage and an ability of driving large currents.

SUMMARY OF THE INVENTION

The present invention may provide a highly-reliable semiconductor device and a method of fabricating the same.

The present invention may also provide a semiconductor device with the minimized resistance and a method of fabricating the same.

The present invention may also provide a semiconductor device with a high breakdown voltage and a method of fabricating the same.

Embodiments of the present invention provide methods of fabricating a semiconductor device may include: forming a trench in a semiconductor substrate of a first conductive type; forming a trench dopant containing layer including a dopant of a second conductive type on a sidewall and a bottom surface of the trench; forming a doping region by diffusing the dopant in the trench dopant containing layer into the semiconductor substrate; and removing the trench dopant containing layer.

In some embodiments, the methods may further include: forming a recess region in the semiconductor substrate; forming a body dopant containing spacer including the second conductive type dopant on a sidewall of the recess region; and forming a body region by diffusing the dopant in the body dopant containing spacer into the semiconductor substrate.

In other embodiments, the methods may further include: removing the body dopant containing spacer; forming a gate insulation layer to cover a bottom surface and a sidewall of the recess region; and forming a gate electrode to fill the recess region.

In still other embodiments, the forming of the trench may include forming a sub trench at one side of the body region and forming a main trench by etching a bottom surface of the sub trench, and the methods may further include, before the forming of the main trench, forming a ground region extending into the body region by implanting the second conductive type dopant into the bottom surface of the sub trench.

In even other embodiments, a concentration of the second conductive type dopant may be higher in the ground region than the body region.

In yet other embodiments, the dopant in the trench dopant containing layer may diffuse into the semiconductor substrate through heat treatment.

In further embodiments, the methods may further include forming a semiconductor layer on the sidewall and the bottom surface of the trench.

In still further embodiments, the methods may further include: forming a source region by implanting the first conductive type dopant into an upper portion of the semiconductor layer, an upper portion of the body region, and an upper portion of the ground region; and forming a drain region by implanting the first conductive type dopant into a bottom surface of the semiconductor substrate.

In even further embodiments, the methods, after the forming of the semiconductor layer, may further include forming a gap fill insulation pattern that fills the trench.

In yet further embodiments, the trench dopant containing layer may include one of Boron Silica Glass (BSG) or Phosphorus Silica Glass (PSG).

In yet further embodiments, the semiconductor substrate may include a base substrate and an epitaxial substrate on the base substrate; and the trench is formed in the epitaxial substrate.

In yet further embodiments, the doping region may contact the base substrate.

In yet further embodiments, the doping region may not contact the base substrate because a portion of the epitaxial substrate is interposed between the base substrates.

In other embodiments of the present invention, methods of fabricating a semiconductor device include: forming a first trench on a semiconductor substrate of a first conductive type; forming a first trench dopant containing layer including a dopant of a second conductive type on a sidewall and a bottom surface of the first trench; forming a first doping region by diffusing the dopant in the first trench dopant containing layer into the semiconductor substrate; forming a second trench by etching the bottom surface of the first trench; forming a second trench dopant containing layer including the second conductive dopant on a sidewall and a bottom surface of the second trench; forming a second doping region by diffusing the dopant of the second trench dopant containing layer into the semiconductor substrate; and removing the second trench dopant containing layer.

In some embodiments, the methods may further include forming a semiconductor layer on the sidewall and the bottom surface of the second trench.

In other embodiments, the methods, before the forming of the second trench, may further include removing the first trench dopant containing layer on the bottom surface of the first trench and the first trench dopant containing layer remaining on the sidewall of the first trench.

In still other embodiments, a width of a lower region of the second trench may be narrower than that of an upper region of the second trench.

In still other embodiments of the present invention, semiconductor devices include: gap fill insulation patterns filling trenches in a substrate; a semiconductor pillar defined between the gap fill insulation patterns and doped with a dopant of a first conductive type; a gate electrode disposed in a recess region in the semiconductor pillar; a doping region disposed below the trenches and doped with a dopant of a second conductive type; and a body region disposed in the semiconductor pillar and surrounding a sidewall of the recess region, wherein the body region is doped with the second conductive type dopant; and a width of an upper region of the trenches is broader than of a lower region of the trenches.

In some embodiments, a sidewall of the trenches may have a step-shaped structure.

In other embodiments, the doping region may include a first doping region adjacent to a boundary between the upper region and the lower region of the trenches and a second doping region except the first doping region; and a concentration of the second conductive type dopant of the first doping region may be higher than that of the second doping region.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIGS. 1A through 1I are views illustrating a method of fabricating a semiconductor device according to a first embodiment of the present invention;

FIGS. 5A through 5F are views illustrating a method of fabricating a semiconductor device according to a third embodiment of the present invention.

DETAILED DESCRIPTION OF PREFERRED EMBODIMENTS

Figure 1B:
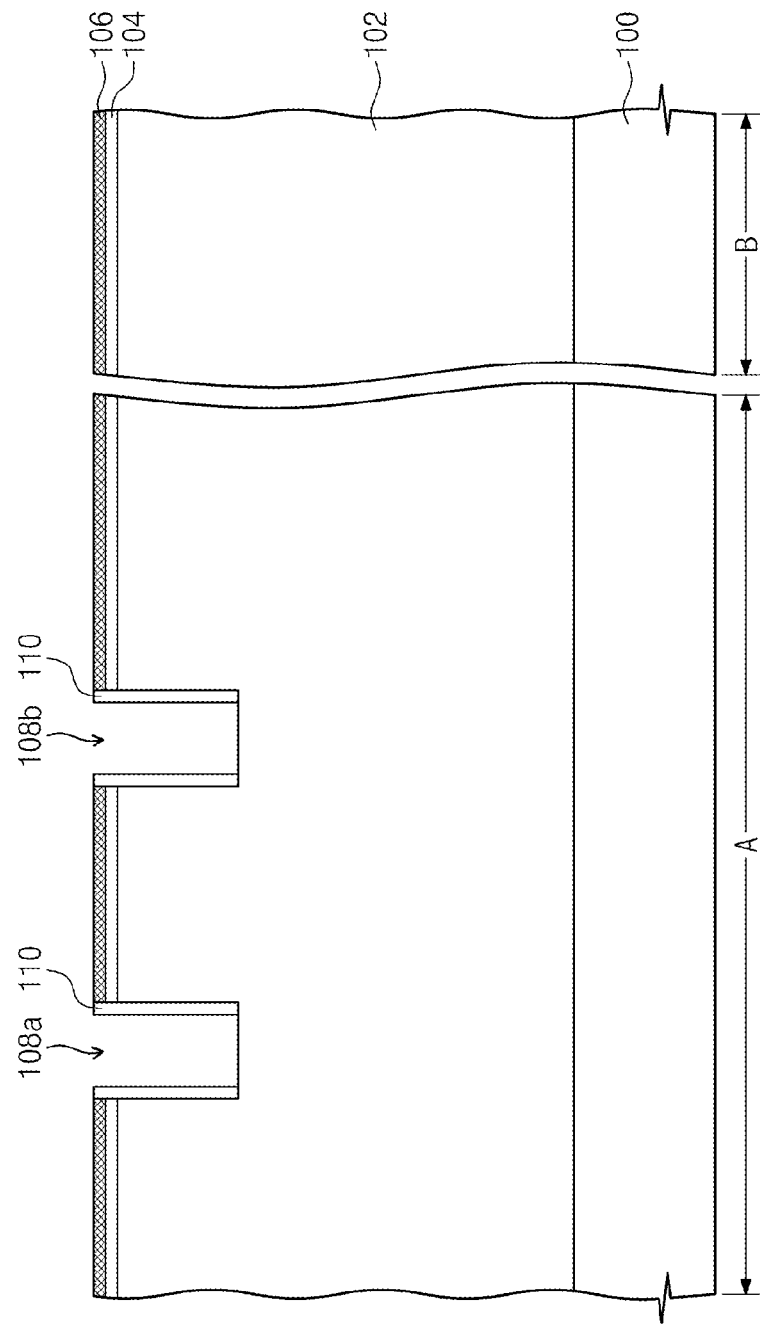

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. As used herein, the term and/or includes any and all combinations of one or more of the associated listed items.

Also, though terms like a first and a second are used to describe various members, components, regions, layers, and/or portions in various embodiments of the present invention, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment can be referred to as a second member, a second component, a second region, a second layer, or a second portion in another embodiment. Like reference numerals refer to like elements throughout.

A method of fabricating a semiconductor according to a first embodiment of the present invention is described.

FIGS. 1A through 1I are views illustrating a method of fabricating a semiconductor device according to a first embodiment of the present invention.

Referring to FIG. 1A, semiconductor substrates 100 and 102 including a base substrate 100 and an epitaxial substrate 102 on the base substrate 100 are provided. The base substrate 100 may be doped with a first conductive type dopant. The epitaxial substrate 102 may be formed on the base substrate 100 through an epitaxial process. The epitaxial substrate 102 may be doped with the same conductive type dopant as the base substrate 100. For example, the base substrate 100 and the epitaxial substrate 102 may be doped with an N-type dopant. The semiconductor substrates 100 and 102 may be a silicon substrate or a germanium substrate.

The semiconductor substrate 100 may include a cell region A and an electrode region B.

A thick oxide layer 104 and a nitride layer 106 may be formed on the epitaxial substrate 102. Recess regions 108a and 108b may be formed in the cell region A by sequentially etching the nitride layer 106, the thick oxide layer 104, and the epitaxial substrate 102. The nitride layer 106, the thick oxide layer 104, and the epitaxial substrate 102 may be etched through an anisotropic etching process. The base substrate 100 may not be etched. The bottom surfaces of the recess regions 108a and 108b may be formed of the epitaxial substrate 102.

After the forming of the recess regions 108a and 108b, an oxide layer may be formed on the inside of the recess regions 108a and 108b and the oxide layer may be removed through a wet etching method.

Referring to FIG. 1B, a body dopant containing spacer 110 may be formed on the sidewalls of the recess regions 108a and 108b. The body dopant containing spacer 110 may have a different conductive type dopant than the semiconductor substrates 100 and 102. For example, if the semiconductor substrates 100 and 102 are doped with the first conductive type dopant, the body dopant containing spacer 110 may include a second conductive type dopant. The body dopant containing spacer 110 may be formed by forming a body dopant containing layer including the second conductive type dopant on the semiconductor substrates 100 and 102 and anisotropically etching the body dopant containing layer. Thereby, the bottom surfaces of the recess regions 108a and 108b may be exposed. The body dopant containing layer may be one of Boron Silica Glass (BSG) or Phosphorus Silica Glass (PSG), formed through Plasma-Enhanced Chemical Vapor Deposition (PECVD).

Referring to FIG. 1C, a thermal treatment process may be performed. Thereby, the second conductive type dopants in the body dopant containing spacer 110 may penetrate the sidewalls of the recess regions 108a and 108b to diffuse into the epitaxial substrate 102. A portion of the epitaxial substrate 102 adjacent to the sidewalls of the recess regions 108a and 108b may be counter-doped with the second conductive type dopant, so that a body region 112 may be formed. The body region 112 may surround the sidewalls of the recess regions 108a and 108b.

After the forming of the body region 112, the nitride layer 106 may be removed. Unlike this, before the first dopant containing spacer 110 is thermally treated, the nitride layer 106 may be removed.

Referring to FIG. 1D, the body dopant containing spacer 110 may be removed. The body dopant containing spacer 110 may be removed through a wet etching method. After the removing of the body dopant containing spacer 110, the bottom surfaces of the recess regions 108a and 108b may be etched. Thereby, the depths of the recess regions 108a and 108b may be further deeper. After the etching of the bottom surfaces of the recess regions 108a and 108b, an oxide layer may be formed on the bottom surface and the sidewall of the recess regions 108a and 108b and then may be removed.

First and second gate insulation layers 113a and 113b may be formed on the bottom surface and the sidewall of the recess regions 108a and 108b. The gate insulation layers 113a and 113b may include a thermal oxide layer and/or a Tetra-Ethyl-Ortho-Silicate (TEOS) formed by a chemical vapor deposition method.

After the forming of the gate insulation layers 113a and 113b, a first gate electrode 114a filling the first recess region 108a may be formed and a second gate electrode 114b filling the second recess region 108b may be formed. The second gate electrode 114b may include a body part filling the second recess region 108b and a contact part extending from one end of the body part in a direction parallel to the top surface of the base substrate 100. The gate electrodes 114a and 114b may include a conductive material of the first conductive type dopant. For example, the gate electrodes 114a and 114b may include polycrystalline silicon of phosphorus and/or arsenic.

After the forming of the gate electrodes 114a and 114b, capping insulation layers 116a and 116b covering the respective gate electrodes 114a and 114b may be formed. The capping insulation layers 116a and 116b may be a silicon oxide layer formed through a thermal oxidization method.

Figure 1E:
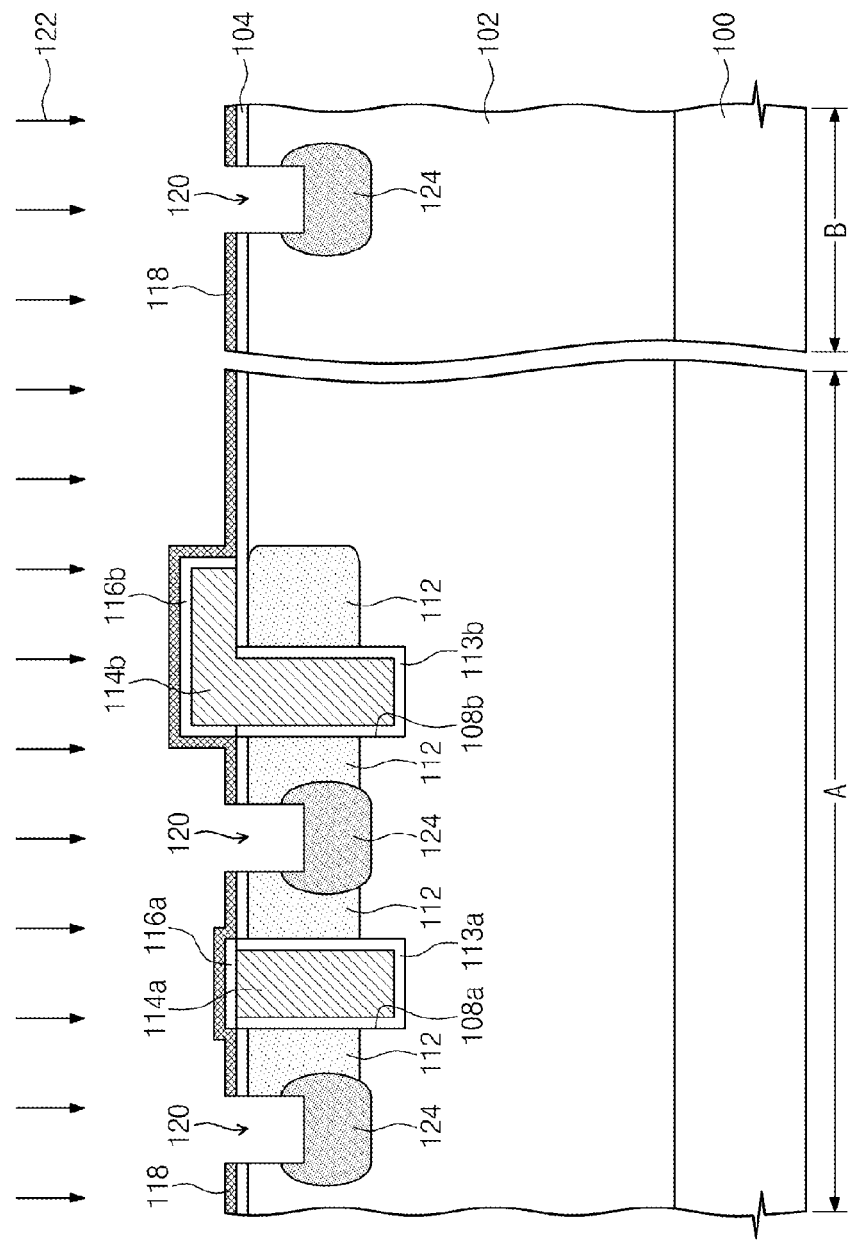

Referring to FIG. 1E, a hard mask layer may be formed on the semiconductor substrates 100 and 102 and a hard mask pattern 118 may be formed by patterning the hard mask layer. By using the hard mask pattern 118 as an etch mask, the thick oxide layer 104 and the epitaxial substrate 102 may be etched to form sub trenches 120. For example, the sub trenches 120 may be formed at one side of the first gate electrode 114a between the gate electrodes 114a and 114b and in the electrode region B. The one side of the first gate electrode 114a may face the other side of the first gate electrode 114a adjacent to the second gate electrode 114b. Based on the top surfaces of the base substrate 100, the bottom surfaces of the sub trenches 120 may be positioned at a higher level than the bottom surfaces of the gate electrodes 114a and 114b.

After the forming of the sub trench 120, a dopant ion 122 of the second conductive type may be implanted using the hard mask pattern 118 as an ion implantation mask. The dopant ion 122 of the second conductive type may be implanted on the bottom surface of the sub trench 120. Next, through a thermal treatment process, the second conductive type dopant ion 122 implanted on the bottom surface may diffuse to form a ground region 124. The ground region 124 may overlap the body region 112. A concentration of the second conductive type dopant in the ground region 124 may be higher than that in the body region 112.

Figure 1F:
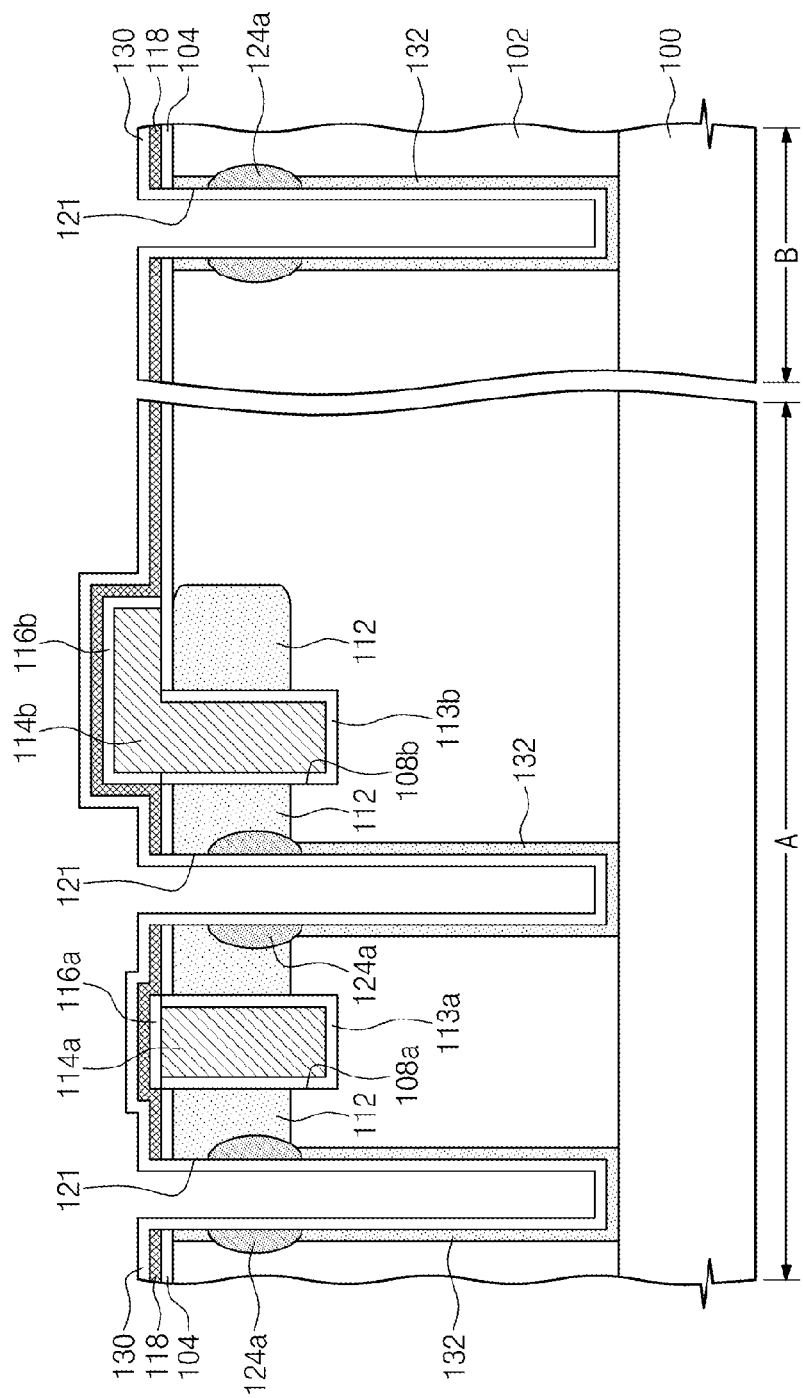

Referring to FIG. 1F, the bottom surfaces of the sub trenches 120 may be further etched to form main trenches 121. The bottom surfaces of the sub trenches 120 may be etched through an anisotropic etching process using the hard mask pattern 118 as an etch mask. Thereby, the ground region 124 below the bottom surfaces of the sub trenches 120 may be etched so that a ground region 124a divided into the both sides of each of the main trenches 121 may be formed. The bottom surfaces of the main trenches 121 may be formed of the epitaxial substrate 102.

After the forming of the main trenches 121, a trench dopant containing layer 130 may be formed on the semiconductor substrate 100 and 102. The trench dopant containing layer 130 may include the second conductive type dopant. The trench dopant containing layer 130 may be conformally formed on the bottom surfaces and the sidewalls of the main trenches 121, so that empty inner spacers surrounded by the trench dopant containing layer 130 may be defined in the main trenches 121. The trench dopant containing layer 130 may be one of BSG or PSG formed through PECVD.

A thermal treatment process may be performed. Thereby, the second conductive type dopants in the trench dopant containing layer 130 penetrates the sidewalls and the bottom surfaces of the main trenches 121 to spread into the epitaxial substrate 102. Portions of the epitaxial substrate 102 adjacent to the sidewalls and the bottom surfaces of the main trenches 121 may be counter-doped with the second conductive type dopant, so that a doping region 132 may be formed. The doping region 132 may contact the base substrate 100.

Since the dopant of the trench dopant containing layer 130 diffuses to form the doping region 132, a concentration of the second conductive type dopant in the doping region 132 may be uniform. Accordingly, a turn on resistance of a semiconductor device is reduced such that its reliability may be improved. If the doping region is formed through an ion implantation method, a concentration of the second conductive type dopant in the doping region may be uneven due to the depth of the main trench 121, and accordingly, reliability of the semiconductor device may be deteriorated. However, as mentioned above, the doping region 132 may form a trench dopant containing layer 130 in the main trench 121, and the trench dopant containing layer 130 may be formed through a thermal treatment process, so that a concentration of the second conductive type dopant may be uniform in the doping region 132.

A concentration of the second conductive type dopant in a portion of the body region 112 adjacent to the sidewalls of the main trenches 121 may be higher than that in another portion of the body region 112. A concentration of the second conductive type dopant in a portion of the ground region 124a adjacent to the sidewalls of the main trenches 121 may be higher than that in another portion of the ground region 124a.

Figure 1G:
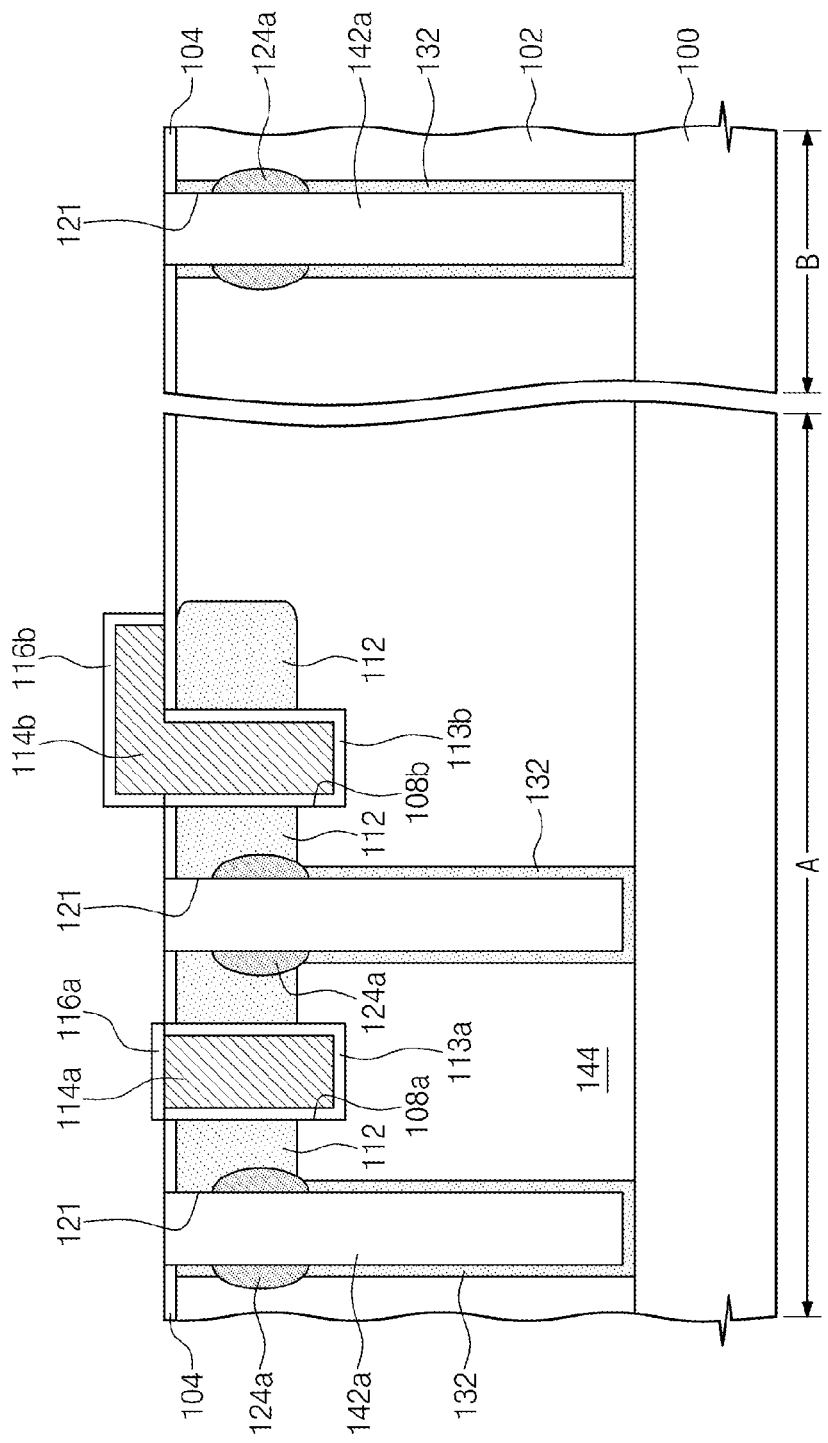

Referring to FIG. 1G, after the forming of the doping region 132, the trench dopant containing layer 130 may be removed. The trench dopant containing layer 130 may be removed through a wet etching method. After the removing of the trench dopant containing layer 130, gap fill insulation patterns filling the inner spaces in the main trenches 121 may be formed. According to an embodiment, the sidewalls and bottom surfaces of the gap fill insulation patterns 142a may contact the doping region 132.

The gap fill insulation patterns 142a may be formed by forming an insulation layer filling the main trenches 121 on the semiconductor substrates 100 and 102 and etching the insulation layer using the hard mask pattern 118 as an etch stop layer. After the forming of the gap fill insulation patterns 142a, the hard mask pattern 118 may be removed.

A semiconductor pillar 144 may be defined between the respectively adjacent gap fill insulation patterns 142a. The semiconductor pillar 144 may be doped with the first conductive type dopant. The semiconductor pillar 144 may be a portion of the epitaxial substrate 102 disposed between the respectively adjacent gap fill insulation patterns 142a.

Figure 1H:
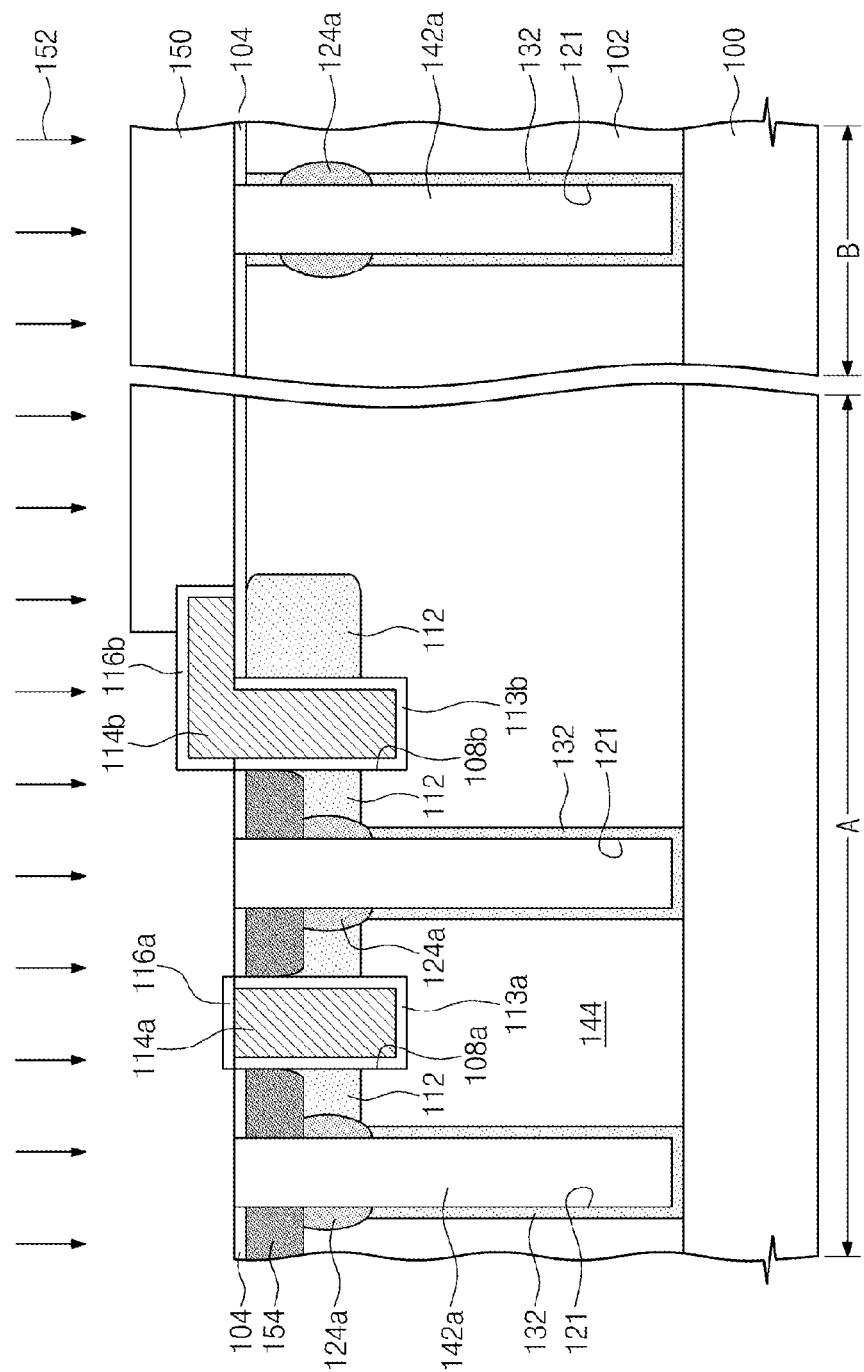

Referring to FIG. 1H, a mask layer 150 covering the electrode region B may be formed. The mask layer 150 may be a photoresist layer. The mask layer 150 may cover a portion of the second gate electrode 114b adjacent to the electrode region B and may not over the semiconductor pillar 144, the body region 112, the ground region 124a and the gap fill insulation patterns 142a.

A dopant ion 152 of the first conductive type may be implanted using the mask layer 150 as an ion implantation mask. In this case, the insulation layer 104 may be used as a buffer layer for implanting the first conductive type dopant ion 152. Upper portions of the body region 112 and the ground region 124a may be counter-doped with the first conductive type dopant. The first conductive type dopant ion 152 may not be implanted on the body region 112 below the contact part of the second gate electrode 114b.

By implanting the first conductive type dopant ion 152 into the upper portion of the body region 112 and the upper portion of the ground region 124a, a source region 154 doped with the first conductive type dopant may be formed. The source region 154 may be formed at the both sides of the upper regions of the main trenches 121. The source region 154 may be formed at the both sides of the first gate electrode 114a and the one side of the second gate electrode 114b adjacent to the first gate electrode 114a.

Referring to FIG. 1I, an inter layer insulation layer 160 may be formed on the semiconductor substrates 100 and 102. A first wiring 162 contacting the source region 154, a second wiring 164 contacting the second gate electrode 114b, and a third wiring 166 on the electrode region B may be formed. The forming of the first to third wirings 162, 164, and 166 may include forming openings to expose a portion of the source region 154, the top surfaces of the gap fill insulation patterns 142a, and a portion of the contact part of the second gate electrode 114b, removing an upper portion of the gap fill insulation patterns 142a, forming a conductive layer to fill an upper region of the trench 121 without the gap fill insulation patterns 142a, and patterning the conductive layer. The conductive layer may include metal.

A drain region 168 doped with the first conductive type dopant may be formed on the bottom surface of the base substrate 100. The drain region 168 may be formed by implanting the first conductive type dopant on the bottom surface of the base substrate 100. The bottom surface of the base substrate 100 may face the top surface of the base substrate 100 contacting the epitaxial substrate 102.

A semiconductor device formed through to the method of fabricating a semiconductor device according to the first embodiment of the present invention will be described with reference to FIG. 1I.

Referring to FIG. 1I, semiconductor substrates 100 and 102 including a cell region A and an electrode region B are provided. The semiconductor substrates 100 and 102 may include a base substrate 100 of a first conductive type and an epitaxial substrate 102 of the first conductive type disposed on the base substrate 100.

A plurality of trenches 121 may be disposed in the epitaxial substrate 102. Each of the trenches 121 may be filled with the gap fill insulation patterns 142a. According to an embodiment, the gap fill insulation patterns 142a may fill the insides of the trenches 121. The gap fill insulation pattern 142a may contact the inner surfaces of the trenches 121. A semiconductor pillar 144 may be defined between the respectively adjacent gap fill insulation patterns 142a. The semiconductor pillar 144 may be a portion of the epitaxial substrate 102 interposed between the respectively adjacent gap fill insulation patterns 142a.

Recess regions 108a and 108b may be formed in the epitaxial substrate 102 at one side of the trenches 121. For example, the recess regions 108a and 108b may include a first recess region 108a formed in the semiconductor pillar 144 defined by the gap fill insulation patterns 142a and a second recess region 108b formed at one side of the trench 121 adjacent to the electrode region B. Based on the top surface of the base substrate 100, the bottom surfaces of the recess regions 108a and 108b may be disposed at a higher level than the bottom surfaces of the trenches 121.

A first gate insulation layer 113a may cover the bottom surface and the side surface of the first recess region 108a and a first gate electrode 114a may fill an inner space surrounded by the first gate insulation layer 113a in the first recess region 108a. A second gate insulation layer 113b may cover the bottom surface and the side surface of the second recess region 108b and a second gate electrode 114b may fill an inner space surrounded by the second gate insulation layer 113b in the second recess region 108b. The second gate electrode 114b may include a body part filling the second recess region 108b and a contact part extending in a direction parallel to the top surface of the base substrate 100 at one end of the body part. First and second capping insulation layers 116a and 116b may respectively cover the top surfaces of the first gate electrode 114a and the contact part of the second gate electrode 114b.

A body region 112 may surround the sidewalls of the recess regions 108a and 108b. The body region 112 may surround the upper portions of the sidewalls of the recess regions 108a and 108b. The lower portions and bottom surfaces of the sidewalls of the recess regions 108a and 108b may be formed of the epitaxial substrate 102. The body region 112 may be a portion of the epitaxial substrate 102 adjacent to the upper portions of the sidewalls of the recess regions 108a and 108b, which may be counter-doped with the second conductive type dopant.

A ground region 124a may surround the upper portion of the sidewall of the trench 121. The ground region 124a may be a portion of the epitaxial substrate 102 adjacent to the upper portion of the sidewall of the trench 121, which may be counter-doped with the second conductive type dopant. A concentration of the second conductive type dopant of the ground region 124a may be higher than that of the body region 112.

A doping region 132 may be formed below the inside of the trench 121. The doping region 132 may be a portion of the epitaxial substrate 102 adjacent to the remaining portion except the bottom surface and the upper portion of the sidewall of the trench 121, which may be counter-doped with the second conductive type dopant. The doping region 132 below the bottom surface of the trench 121 may contact the base substrate 100. A concentration of the second conductive type dopant of the doping region 132 may be lower than that of the ground region 124a. According to an embodiment, the doping region 132 may directly contact the gap fill insulation patterns 142a.

A source region 154 may be disposed in the epitaxial substrate 102 at the both sides of the trenches 121. The source region 154 may be disposed between the first recess region 108a and the trenches 121. The source region 154 may be an upper portion of the ground region 124a and an upper portion of the body region 112 adjacent to the top surface of the epitaxial substrate 102, all of which may be doped with the first conductive type dopant.

A drain region 168 doped with the first conductive type dopant may be disposed on the bottom surface of the base substrate 100. The drain region 168 may be formed by implanting a dopant ion of the first conductive type into the bottom surface of the base substrate 100.

A first wiring 162 penetrating the thick oxide layer 104 and the interlayer insulation layer 161 formed on the epitaxial substrate 102 to contact the source region 154, a second wiring 164 penetrating the interlayer insulation layer 161 and the second capping insulation layer 116b to contact the second gate electrode 114b, and a third wiring 166 on the interlayer insulation layer 161 of the electrode region B may be disposed.

According to the first embodiment of the present invention, the doping region below the bottom surface of the trench 121 contacts the base substrate 100. Unlike this, according to a modification of the first embodiment of the present invention, a doping region may not contact the base substrate 100. This will be described with reference to FIG. 2.

Figure 2:
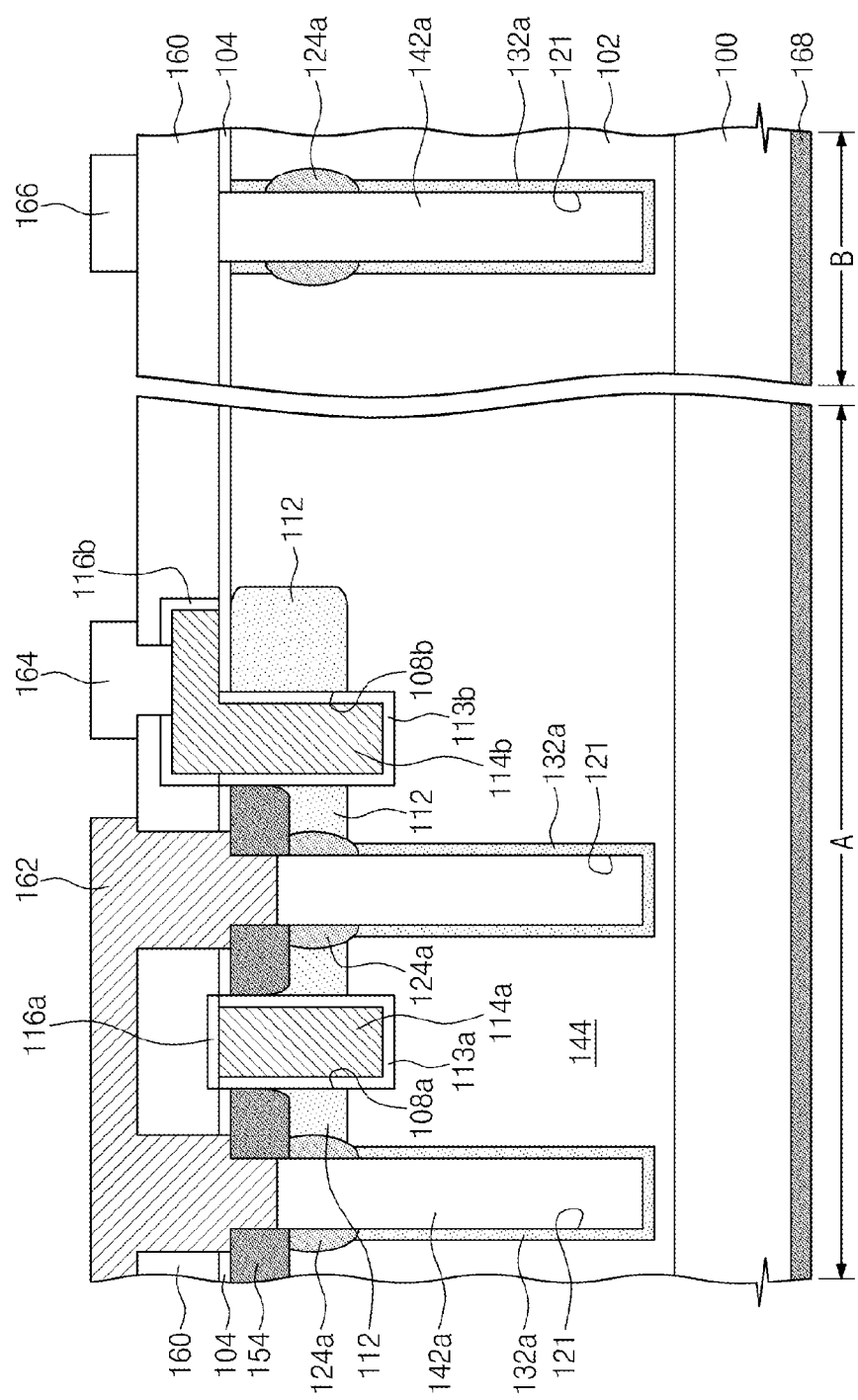
FIG. 2 is a view illustrating a semiconductor device according to a modification of the first embodiment of the present invention.

FIG. 2 is a view illustrating a semiconductor device according to a modification of the first embodiment of the present invention.

Referring to FIG. 2, the semiconductor device according to a modification of the first embodiment of the present invention is similar to that described with reference to FIG. H. However, a doping region 132a below the bottom surface of a trench 121 may not contact the top surface of the base substrate 100. Thereby, a semiconductor pillar 144 and an epitaxial substrate 102 may contact each other.

Unlike the method of fabricating a semiconductor device according to the first embodiment of the present invention, a semiconductor layer may be formed between a trench and a gap fill insulation pattern. This will be described with reference to FIGS. 3A and 3C.

Figure 3A:
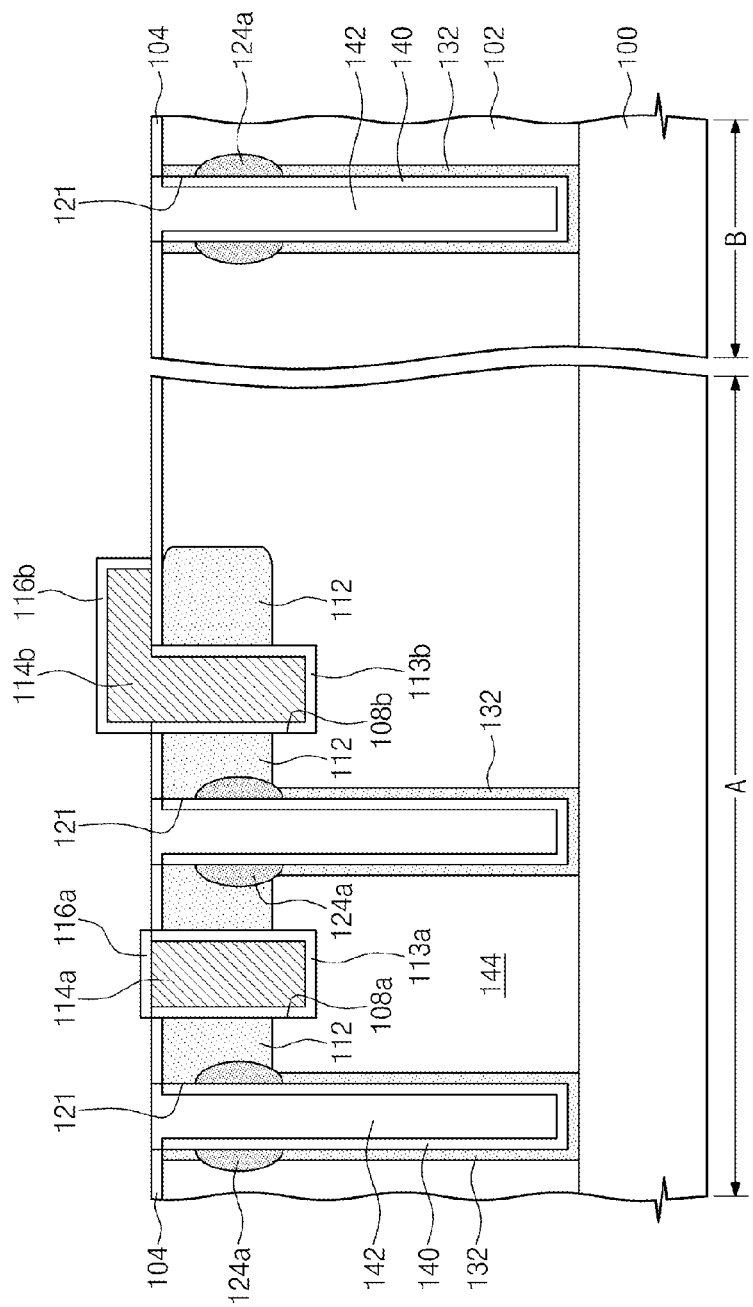
FIGS. 3A and 3C are views illustrating a method of fabricating a semiconductor device according to a second embodiment of the present invention.
Figure 3B:
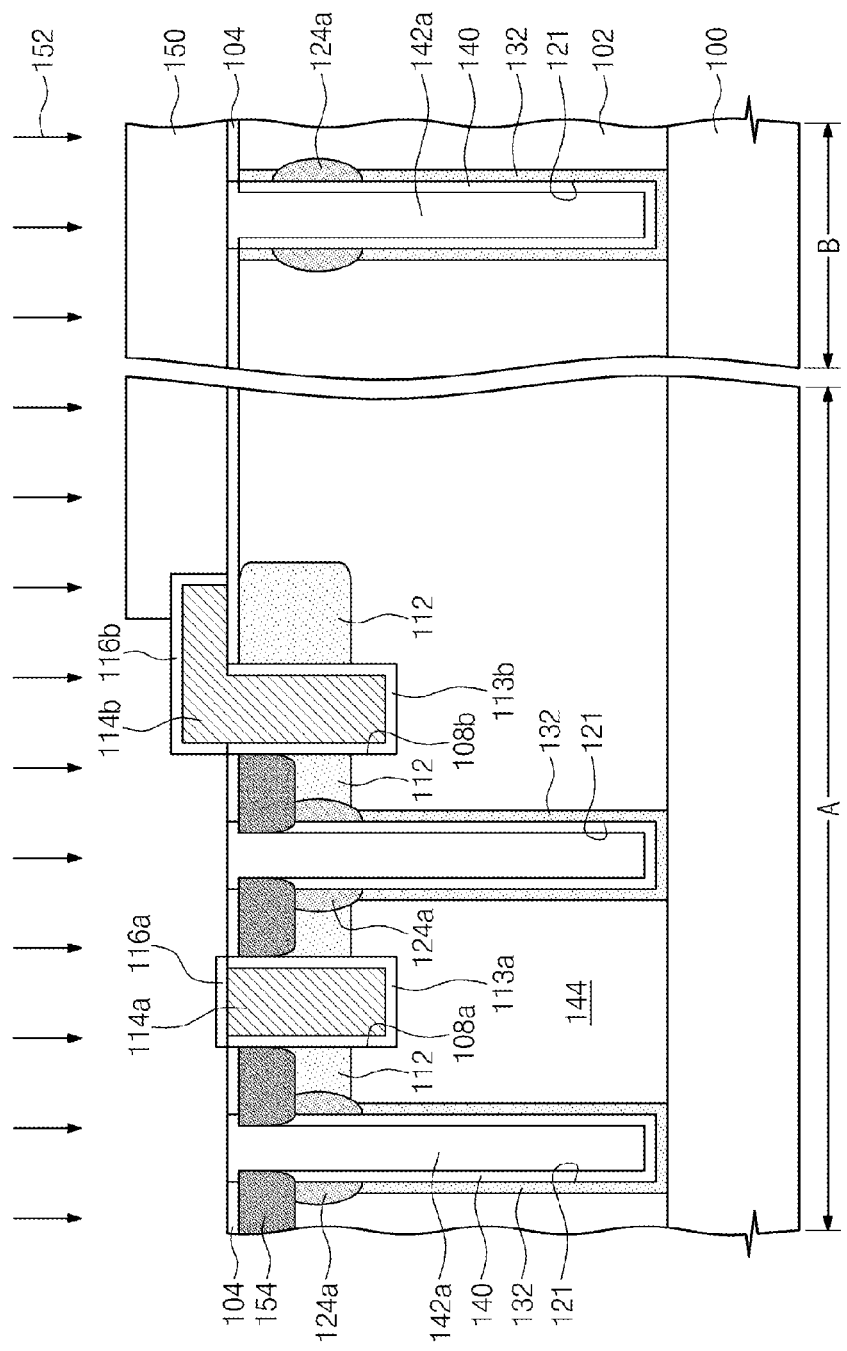
Figure 3C:
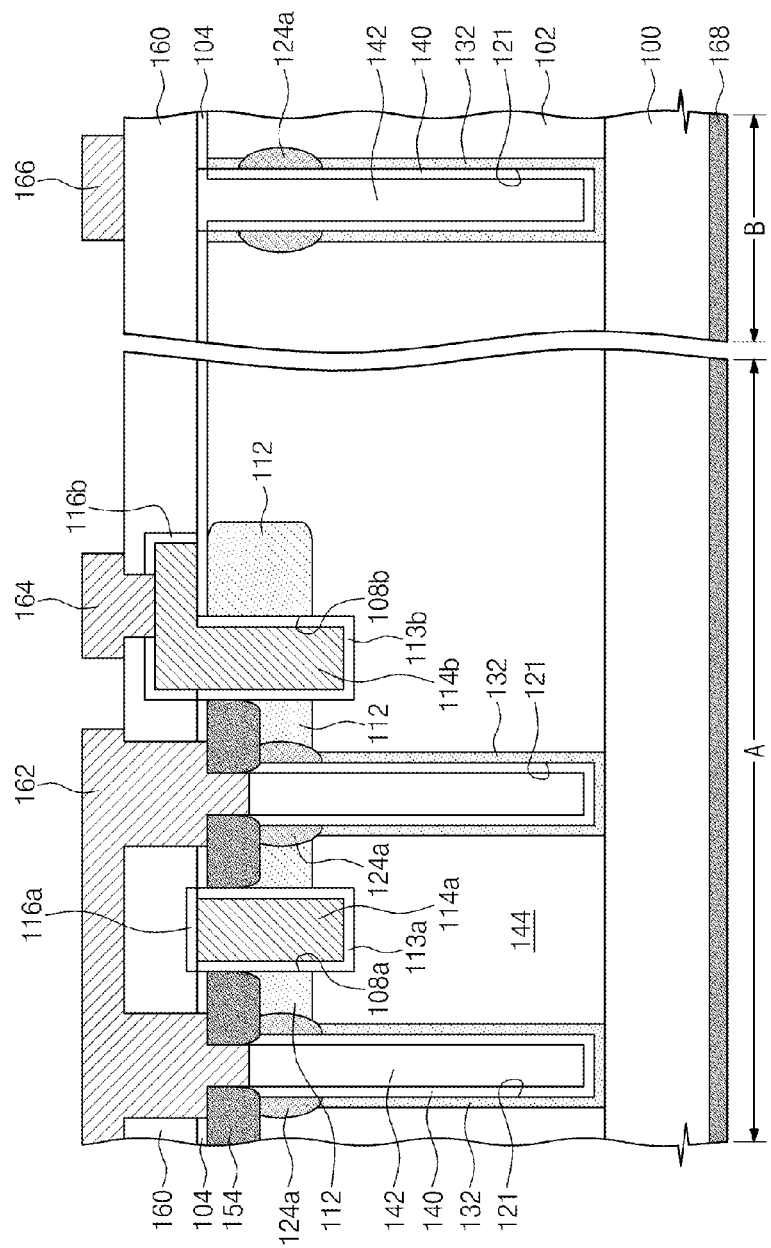

FIGS. 3A and 3C are views illustrating a method of fabricating a semiconductor device according to a second embodiment of the present invention. The semiconductor device according to this embodiment may include all the contents described with reference to FIGS. 1A through 1F.

Referring to FIG. 3A, after the forming of the doping region 132, the trench dopant containing layer 130 may be removed. The trench dopant containing layer 130 may be removed through a wet etching method. After the removing of the trench dopant containing layer 130, a semiconductor layer 140 may be formed on the bottom surfaces and the sidewalls of the main trenches 121. The semiconductor layer 140 may include at least one of an epitaxial layer and a polysilicon layer. If the semiconductor layer 140 includes the epitaxial layer, the semiconductor layer 140 may be formed on the bottom surfaces and the sidewalls of the main trenches 121 through an epitaxial process. The semiconductor layer 140 may be conformally formed on the inner surfaces of the main trenches 121 to define empty inner spaces surrounded by the semiconductor layer 140 in the main trenches 121. The doping region 132 may be doped with the second conductive type dopant. Unlike this, the semiconductor layer 140 may not be doped with the second conductive type dopant.

Gap fill insulation patterns 142 filling the inner spaces of the main trenches 121 may be formed. The gap fill insulation patterns 142 may be formed through the same method as the forming of the gap fill insulation patterns 142a in the above-mentioned first embodiment.

A semiconductor pillar 144 may be formed between the respectively adjacent gap fill insulation patterns 142. The semiconductor pillar 144 may be doped with the first conductive type dopant. The semiconductor pillar 144 may be a portion of the epitaxial substrate 102 disposed between the respectively adjacent gap fill insulation patterns 142.

Referring to FIG. 3B, a mask layer 150 may be formed to cover the electrode region B. The mask layer 150 may cover a portion of the second gate electrode 114b adjacent to the electrode region B, and may not cover the semiconductor pillar 144, the body region 112, the ground region 124a, the semiconductor layer 140, and the gap fill insulation patterns 142.

The first conductive type dopant ion 152 may be implanted using the mask layer 150 as an ion implantation mask. In this case, the insulation layer 104 may be used as a buffer layer for implanting the first conductive type dopant ion 142. The upper portions and the body region 112 and the ground region 124a may be counter-doped with the first conductive type dopant. The first conductive type dopant ion 152 may not be implanted on the body region 112 below the contact portion of the second gate electrode 114b.

A source region 154 doped with the first conductive type dopant may be formed by implanting the first conductive type dopant ion 152 into the upper portion of the body region 112, the upper portion of the ground region 124a, and the upper portion of the semiconductor layer 140. The source region 154 may be formed at both sides of the upper regions of the main trenches 121. The source region 154 may be formed at the both sides of the first gate electrode 114a and the one side of the second gate electrode 114b adjacent to the first gate electrode 114a.

Referring to FIG. 3C, an interlayer insulation layer 160 may be formed on the semiconductor substrates 100 and 102. A first wiring 152 contacting the source region 154, a second wiring 164 contacting the second gate electrode 114b, and a third wiring of the electrode region B may be formed. The forming of the first to third wirings 162, 164, and 166 may be formed through the same method described in the first embodiment. The first to third wirings 162, 164, and 166 may include metal.

A drain region 168 doped with the first conductive type dopant may be formed at the bottom surface of the base substrate 100. The drain region 168 may have the same form and the same method described in the first embodiment.

A semiconductor device formed through the method of fabricating a semiconductor device according to the second embodiment of the present invention will be described with reference to FIG. 3C.

Referring to FIG. 3C, semiconductor substrates 100 and 102 including a cell region A and an electrode region B are provided. The semiconductor substrates 100 and 102 may include a first conductive type base substrate 100 and a first conductive epitaxial substrate 102 on the base substrate 100.

A plurality of trenches 121 may be disposed in the epitaxial substrate 102. Each of the trenches 142 may be filled with a semiconductor layer 140 and gap fill insulation patterns 142. The semiconductor layer 140 may cover the bottom surfaces and the sidewalls of the trenches 121 and fill inner spacers surrounded by the semiconductor layer 140 in the trenches 121. The semiconductor layer 140 may include at least one of an epitaxial layer and a polysilicon layer. A semiconductor pillar 144 may be defined between the respectively adjacent gap fill insulation patterns 142. The semiconductor pillar 144 may be a portion of the epitaxial substrate 102 interposed between the respectively adjacent gap fill insulation patterns 142.

Recess regions 108a and 108b may be disposed in the epitaxial substrate 102 at one side of the trenches 121. The recess regions 108a and 108b may include all contents described in the first embodiment.

A first gate insulation layer 113a may cover the bottom surface and side of the first recess region 108a and may fill an inner space surrounded by the first gate insulation layer 113a in the first recess region 108a. A second gate insulation layer 113b may cover the bottom surface and side of the second recess region 108b and may fill an inner space surrounded by the second gate insulation layer 113b in the second recess region 108b. The second gate electrode 114b may be the same form described in the first embodiment. The top surface of the first gate electrode 114a and the contact portion of the second gate electrode 114b may be covered by first and second capping insulation layers 116a and 116b.

A body region 112 may surround the sidewalls of the recess regions 108a and 108b. A ground region 124a may be disposed to surround the upper portion of the sidewall of the trench 121. The body region 112 and the ground region 124a may have the same form and/or properties described in the first embodiment.

A doping region 132 may be disposed below the inner surface of the trench 121. The doping region 132 may have the same form and/or properties described in the first embodiment.

A source region 154 may be disposed in the epitaxial substrate 102 at both sides of the trenches 121. The source region 154 may be disposed between the first recess region 108a and the trenches 121. The source region 154 may be an upper portion of the semiconductor layer 140, an upper portion of the body region 112, and an upper portion of the ground region 124a adjacent to the top surface of the epitaxial substrate 102, all of which are doped with the first conductive type dopant.

A drain region doped with the first conductive type dopant may be disposed on the bottom surface of the base substrate 100. The drain region 168 may be formed by implanting the first conductive type dopant ion into the bottom surface of the base substrate 100.

A first wiring 162 penetrating a thick oxide layer 104 and an interlayer insulation layer 160 on the epitaxial substrate 102 to contact the source region 154, a second wiring 164 penetrating the interlayer insulation layer 160 and the second capping insulation layer 116b to contact the second gate electrode 114b, a third wiring on the interlayer insulation layer 160 of the electrode region B may be disposed.

According to an embodiment, a doping region 132 below the bottom surface of the trench 121 contacts the base substrate 100. Unlike this, according to a modification of the embodiment, the doping region may not contact the base substrate 100. This will be described with reference to FIG. 4.

Figure 4:
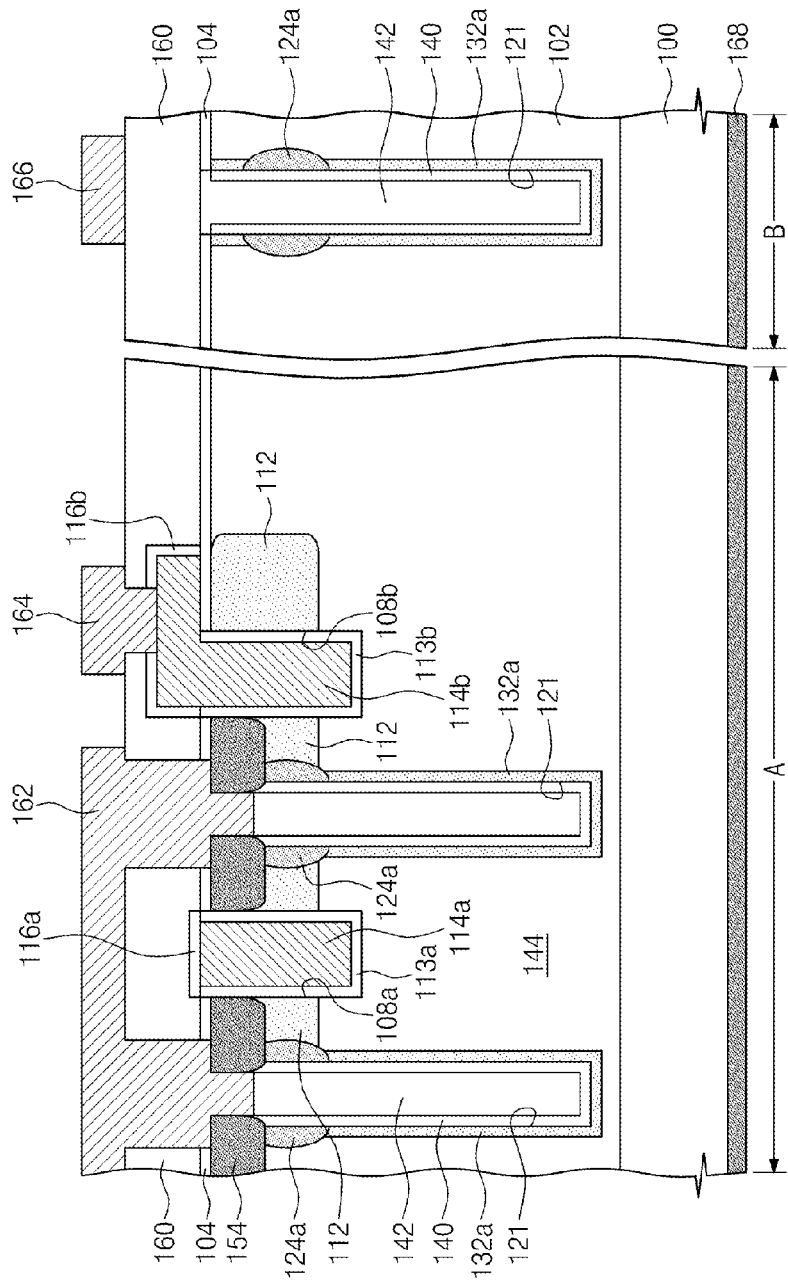
FIG. 4 is a view illustrating a semiconductor device according to a modification of the second embodiment of the present invention.

FIG. 4 is a view illustrating a semiconductor device according to a modification of the second embodiment of the present invention.

Referring to FIG. 4, the semiconductor device according to the modification is similar to that described with reference to FIG. 3C. However, a doping region 132a formed below the bottom surface of the trench 121 may not contact the top surface of the base substrate 100. Therefore, a semiconductor pillar 145 and an epitaxial substrate 102 may contact each other.

Unlike the methods of fabricating a semiconductor device according to the first and second embodiments of the present invention, the trench may be formed through a plurality of etching processes. This will be described with reference to FIGS. 5A through 5F.

FIGS. 5A through 5F are views illustrating a method of fabricating a semiconductor device according to a third embodiment of the present invention. The semiconductor device according to this embodiment may include all the contents described with reference to FIGS. 1A through 1F.

Figure 5A:
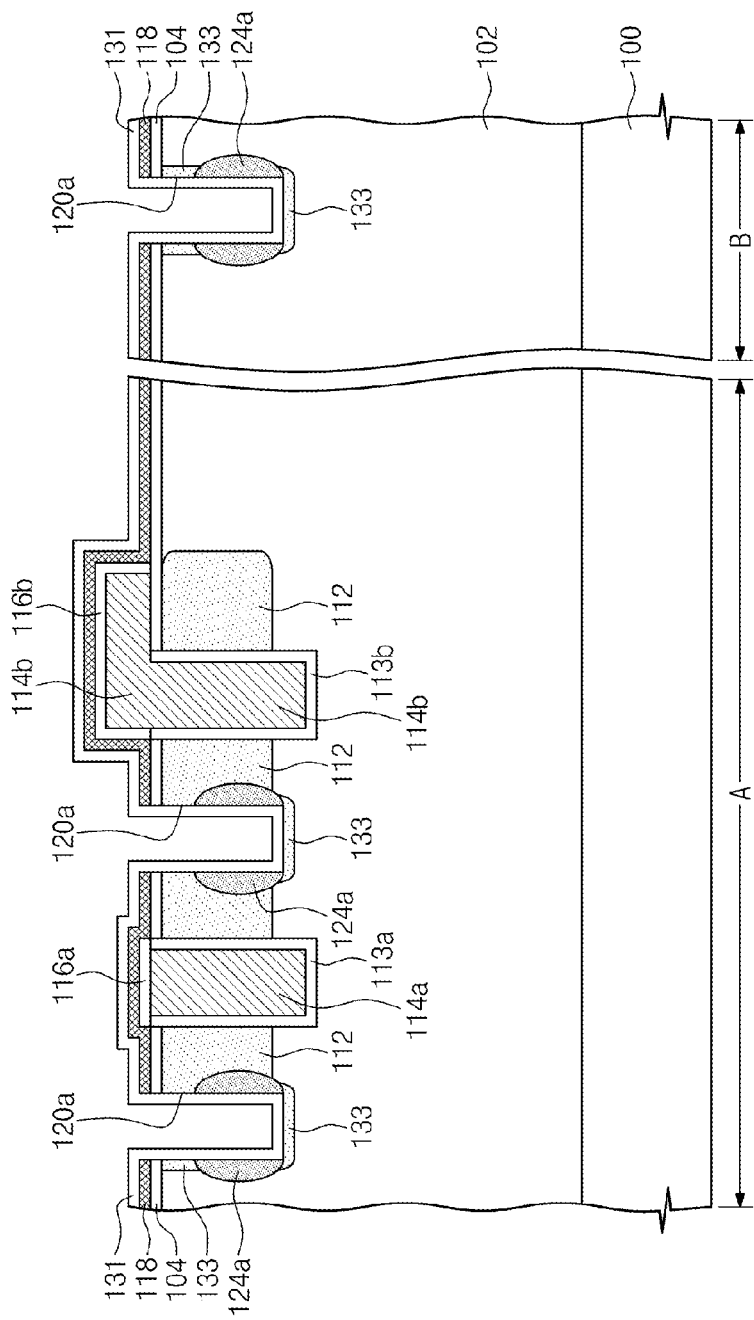

Referring to FIG. 5A, by etching the bottom surfaces of sub trenches 120, first main trenches 120a may be formed. The bottom surfaces of the sub trenches 120 may be etched through an anisotropic etching process using the hard mask pattern 118 as an etch mask until the epitaxial substrate 102 is exposed. Thereby, the bottom surfaces of the first main trenches 120a may be formed of the epitaxial substrate 102. While the bottom surfaces of the sub trenches 120 are etched, a ground region 124 below the bottom surfaces of the sub trenches 120 may be etched, so that a ground region 124a may be divided into the both sides of the first main trenches 120a.

After the forming of the first main trenches 120a, a first trench dopant containing layer 131 may be formed on semiconductor substrates 100 and 102. The first trench dopant containing layer 131 may include a second conductive type dopant. The first trench dopant containing layer 131 is conformally formed on the bottom surfaces and the sidewalls of the first main trenches 120a, sot that empty inner spaces surrounded by the first trench dopant containing layer 131 may be defined in the first main trenches 120a. The first trench dopant containing layer 131 may be formed using the same material and method as the trench dopant containing layer 130 described with reference to FIG. 1F.

A thermal treatment process may be performed. Thereby, the second conductive type dopants in the first trench dopant containing layer 131 may penetrate the bottom surfaces and the sidewalls of the first main trenches 120a to spread into the epitaxial substrate 102. Therefore, a portion of the epitaxial substrate 102 adjacent to the bottoms surfaces and the sidewalls of the first main trenches 120a may be counter-doped with the second conductive type dopant, so that a first doping region 133 may be formed, and also a concentration of the second conductive type dopant a portion of the ground region 124a adjacent to the sidewalls of the first main trenches 120a and a portion of the body region 112 may be increased.

Figure 5B:
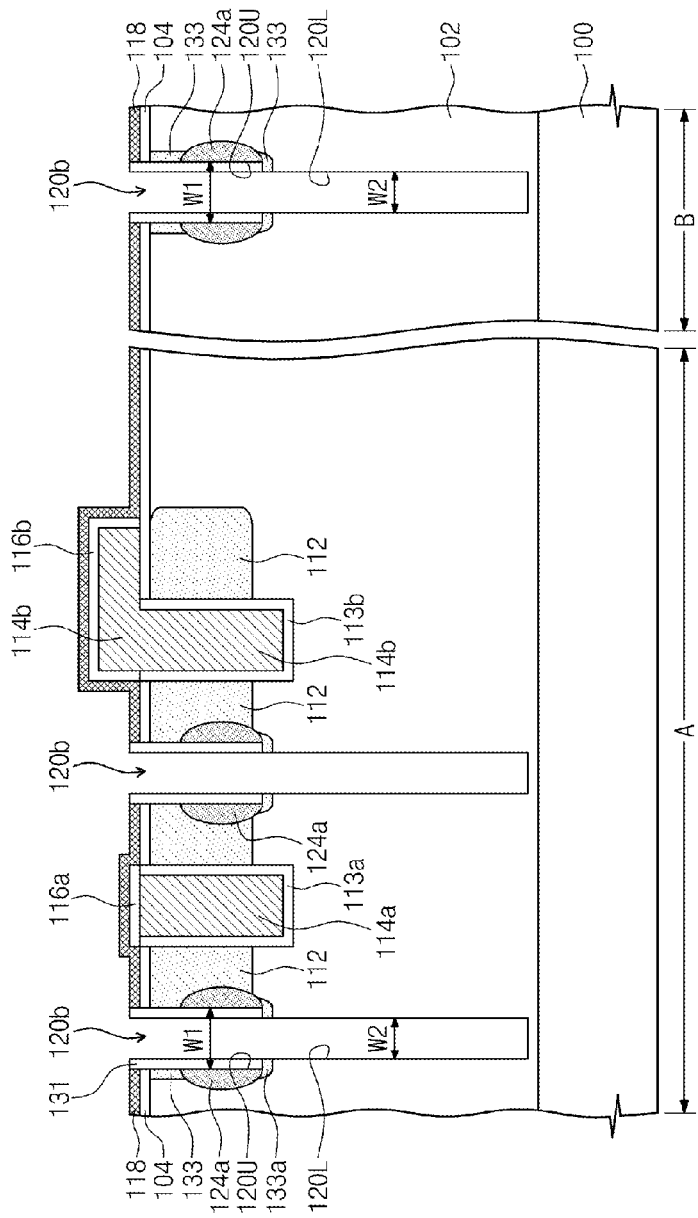

Referring to FIG. 5B, by anisotropically etching the first trench dopant containing layer 131, the first trench dopant containing layer 131 on the bottom surfaces of the first main trenches 120a may be removed, and the first trench dopant containing layer 131 on the sidewalls of the first main trenches 120a may remain. By using the hard mask pattern 118 and the remaining first trench dopant containing layer 131 as an etch stop layer, the bottom surfaces of the first main trenches 120a are etched so that second main trenches 120b may be formed. The first doping region 133 below the bottom surfaces of the first main trenches 120a may be removed. The bottom surfaces of the second main trenches 120b may be formed of the epitaxial substrate 102.

Each of the second main trenches 120b may include an upper region 120U and a lower region 120L. The width W1 of the upper region 120U of the second main trenches 120b may be broader than that W2 of the lower regions 120L of the second main trenches 120b. The upper regions 120L of the second main trenches 120b may be a region where the remaining first trench dopant containing layer 131 is disposed on the sidewall of the second main trenches 120b.

Figure 5C:
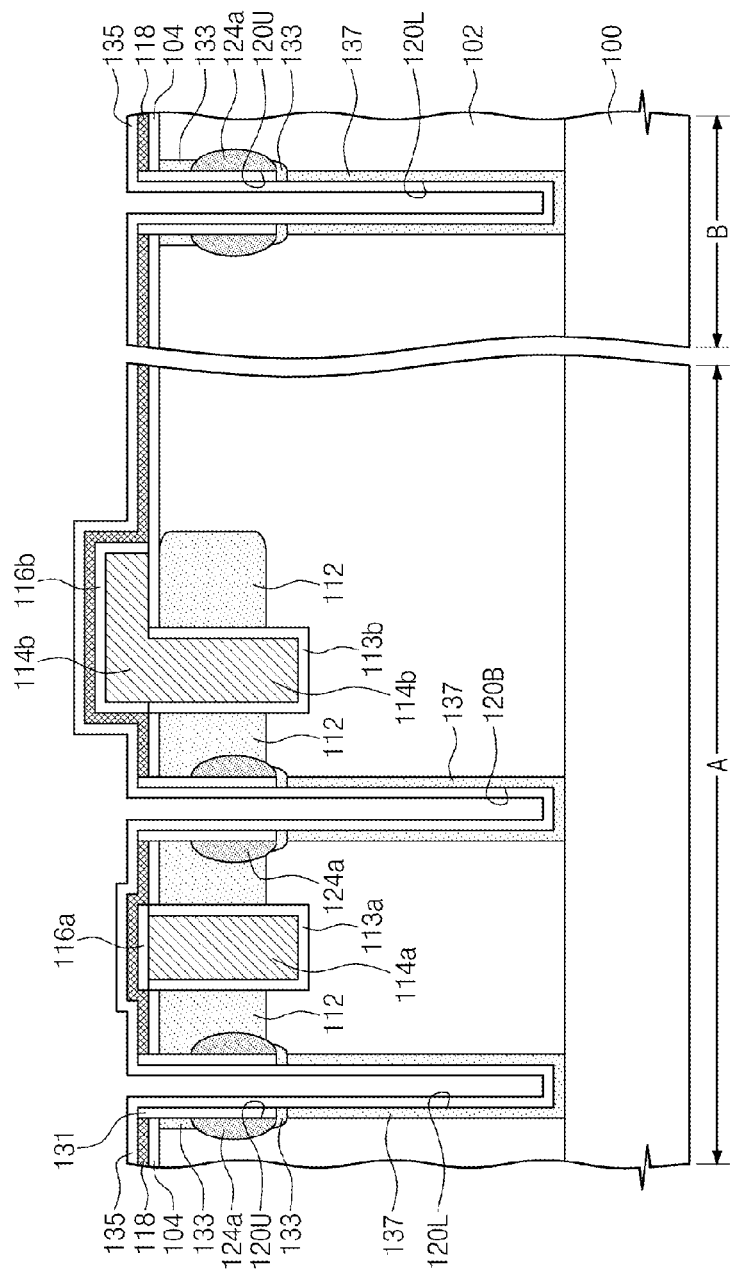

Referring to FIG. 5C, a second trench dopant containing layer 135 may be formed on the semiconductor substrates 100 and 102. The second trench dopant containing layer 135 may include a second conductive type dopant. The second trench dopant containing layer 135 may be conformally formed on the bottom surfaces and the sidewalls of the second main trenches 120b so that empty inner spaces surrounded by the second trench dopant containing layer 135 may be defined in the second main trenches 120b. The second trench dopant containing layer 135 may be formed using the same material and method as the first trench dopant containing layer 131 described with reference to FIG. 3A.

The second trench dopant containing layer 135 may be thermally treated. Therefore, the second conductive type dopants in the second trench dopant containing layer 135 may diffuse into the sidewalls and the bottom surfaces of the second main trenches 120b. Portions of the epitaxial substrate 102 adjacent to the sidewalls and the bottom surfaces of the second main trenches 120b are counter-doped so that a second doping region 137 doped with the second conductive type dopant may be formed. The second doping region 137 below the bottom surfaces of the second main trenches 120b may contact the base substrate 100. The second conductive type dopant in the second trench dopant containing layer 135 diffuses into the first doping region 133, so that a concentration of the second conductive type dopant of the first doping region 133 may be higher than that of the second doping region 137.

Referring to FIG. 5D, the second trench dopant containing layer 135 and the remaining first trench dopant containing layer 131 may be removed. The second trench dopant containing layer 135 and the remaining first trench dopant containing layer 131 may be removed through a wet etching method.

A semiconductor layer 141 may be formed on the bottom surfaces and the sidewalls of the second main trenches 120b. The semiconductor layer 141 may include at least one of epitaxial layer and polysilicon layer. If the semiconductor layer 141 includes the epitaxial layer, the semiconductor layer 141 may be formed on the bottom surfaces and the sidewalls of the second main trenches 120b through an epitaxial process. The semiconductor layer 141 may be conformally formed on the inside of the second main trench 120b, so that empty inner spaces surrounded by the semiconductor layer 141 may be defined in the second main trenches 120b. The semiconductor layer 141 may be doped with the second conductive type dopant. Unlike this, the semiconductor layer 141 may not be doped with the second conductive type dopant.

Gap fill patterns 143 filling the inner space of the second main trenches 120b may be formed. The width of a lower portion of the gap fill insulation pattern 143 filling the lower region of the second main trench 120b may be narrower than the width of an upper portion of the gap fill insulation pattern 143 filling the upper region of the second main trench 120b. The gap fill insulation patterns 143 may be formed using the same method and material as the gap fill insulation patterns 142 described with reference to FIG. 3G in the first embodiment. Unlike those shown in the drawings, according to an embodiment, the semiconductor layer 141 may be omitted. In this case, the cap fill insulation patterns 143 may directly contract the second doping region 137.

A semiconductor pillar 145 may be defined between the respectively adjacent gap fill insulation patterns 143. The semiconductor pillar 145 may be doped with the first conductive type dopant. The semiconductor pillar 145 may be a portion of the epitaxial substrate 102 disposed between the respectively adjacent gap fill insulation patterns 143.

Figure 5E:
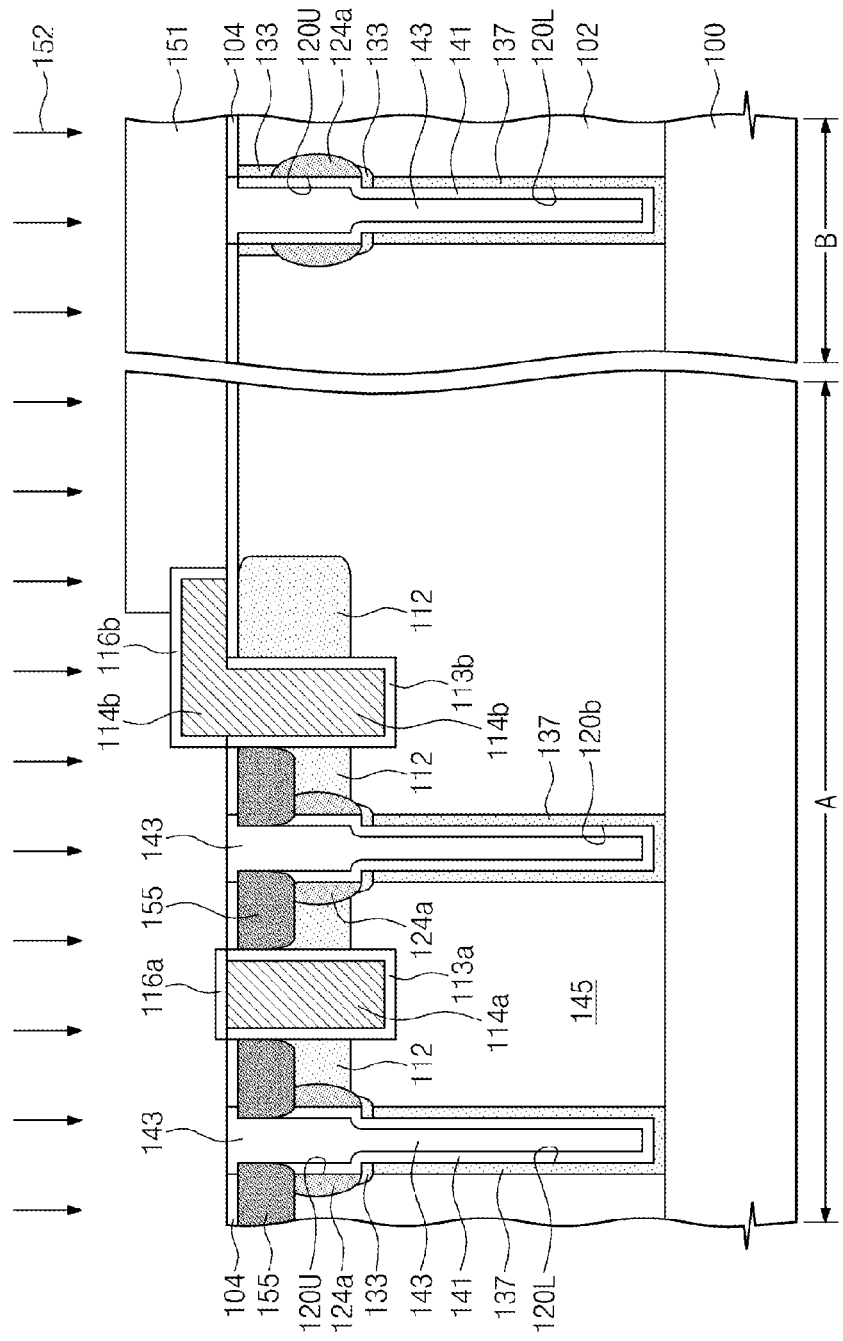

Referring to FIG. 5E, a mask layer 151 covering the electrode region B may be formed. The mask layer 151 may be a photoresist layer. The mask layer 151 covers a portion of the second gate electrode 114b adjacent to the electrode region B and may not cover the semiconductor pillar 144, the body region 112, the ground region 124a, the semiconductor layer 141, and the gap fill insulation patterns 143.

By using the mask layer 151 as an ion implantation mask, the first conductive type dopant ion 152 may be implanted. In this case, the insulation layer 104 may be used as a buffer layer for implanting the first conductive type dopant ion 152. Upper portions of the body region 112 and the ground region 124a may be counter-doped with the first conductive type dopant. The first conductive type dopant ion 152 may not be implanted on the body region 112 below the contact part of the second gate electrode 114b.

The first conductive type dopant ion 152 may be implanted on the upper portion of the body region 112, the upper portion of the ground region 124a, and the upper portion of the semiconductor layer 141, so that a source region 154 doped with the first conductive type dopant may be formed. The source region 154 may be formed at the both sides of the upper region of the second main trench 120b. The source region 154 may be formed at the both sides of the first gate electrode 114a and one side of the second gate electrode adjacent to the first gate electrode 114a.

Referring to FIG. 5F, an interlayer insulation layer 161 may be formed on the semiconductor substrates 100 and 102. A first wiring 162 penetrating the thick oxide layer 104 and interlayer insulation layer 161 to contact the source region 154, a second wiring 164 penetrating the interlayer insulation layer 161 and the second capping insulation layer 116b to contact the second gate electrode 114b, and a third wiring 166 on the interlayer insulation layer 161 of the electrode region B may be formed. The first to third wirings 162, 164, and 166 may be formed using the same method as those 162, 164, and 166 with reference to FIG. 1I in the first embodiment.

A semiconductor device formed according to the method of the third embodiment will be described with reference to FIG. 5F.

Referring to FIG. 5F, semiconductor substrates 100 and 102 including a cell region A and an electrode region B are provided. The semiconductor substrates 100 and 102 may include a first conductive type base substrate 100 and a first conductive type epitaxial substrate 102, which are sequentially stacked.

A plurality of trenches 120b may be formed in the epitaxial substrate 102. Each of the trenches 120b may be filled with a semiconductor layer 141 and gap fill insulation patterns 143. The semiconductor layer 141 includes at least one of epitaxial layer and polysilicon layer. The semiconductor layer 141 may cover the bottom surfaces and the sidewalls of the trenches 120b and may fill inner spaces surrounded by the semiconductor layer 141 in the trenches 120b.

Each of the trenches 120b may include a lower region having a first width and an upper region having a broader width than the lower region. The semiconductor layer 141 may substantially have a uniform thickness. Accordingly, the width of a lower portion of the gap fill insulation patterns 143 filling the lower region of each of the trenches 120b may be narrower than that of an upper portion of the gap fill insulation patterns 143 filling the upper region.

A semiconductor pillar 145 may be defined between the respectively adjacent gap fill insulation patterns 143. The semiconductor pillar 144 may be a portion of the epitaxial substrate 102 interposed between the respectively adjacent gap fill insulation patterns 143.

Recess regions 108a and 108b may be formed in the epitaxial substrate 102 at one side of the trenches 120b. For example, the recess regions 108a and 108b may include a first recess region 108a formed in the semiconductor pillar 114 and a second recess region 108b formed at one side of the trench 120b adjacent to the electrode region B. Based on the top surface of the base substrate 100, the bottom surfaces of the recess regions 108a and 108b may be disposed at a higher level than the bottom surfaces of the trenches 120b.

As described with reference to FIG. 1I in the first embodiment, gate insulation layers 113a and 113b and gate electrodes 114a and 114b may fill the recess regions 108a and 108b. As described with reference to FIG. 1I in the first embodiment, a second gate electrode 114b may include a body part and a contact part, and capping insulation layers 116a and 116b may cover gate electrodes 114a and 114b.

A body region 112 may surround the sidewalls of the recess regions 108a and 108b. The body region 112 may surround upper portions of the sidewalls of the recess regions 108a and 108b, and the lower portions and bottom surfaces of the sidewalls of the recess regions 108a and 108b may be formed of the epitaxial substrate 102. The body region 112 may be a portion of the epitaxial substrate 102 adjacent to the sidewalls of the recess regions 108a and 108b, which is counter-doped with the second conductive type dopant.

A ground region 124a may surround the sidewall of the upper region of the trench 120b. The ground region 124a may be a portion of the epitaxial substrate 102 adjacent to the sidewall of the upper region, which is counter-doped with the second conductive type dopant. A concentration of the second conductive type dopant of the ground region 124a may be higher than that of the body region 112.

First and second doping regions 133 and 137 may be formed below the inside of the trench 120b. The first doping region 133 may be a portion of the epitaxial substrate 102 adjacent to the boundary between the upper region and the lower region, which is counter-doped with the second conductive type dopant. The second doping region 137 may be a portion of the epitaxial substrate 102 adjacent to the bottom surface and sidewall of the bottom region of the trench 120b.

The second doping region 137 below the bottom surface of the trench 120b may contact the base substrate 100. A concentration of the second conductive type of the first doping region 133 may be higher than that of the second doping region 137. A concentration of the second conductive type dopant of the doping regions 133 and 137 may be lower than that of the ground region 124a.

A source region 155 may be disposed in the epitaxial substrate 102 at the both sides of the trenches 120b. The source region 155 may be disposed between the first recess region 108a and the trenches 120b. The source region 155 may be an upper portion of the semiconductor layer 141 adjacent to the top surface of the epitaxial substrate 102, an upper portion of the semiconductor layer 141, an upper portion of the body region 112, and an upper portion of the ground region 124a, all of which are coped with the first conductive dopant.

A drain region 168 doped with the first conductive type dopant may be disposed on the bottom surface of the base substrate 100. The drain region 168 may be formed by implanting the first conductive type dopant ion on the bottom surface of the base substrate 100.

A first wiring 162 penetrating the thick oxide layer 104 and the interlayer insulation layer 161 formed on the epitaxial substrate 102 to contact the source region 155, a second wiring 164 penetrating the interlayer insulation layer 161 and the second capping insulation layer 116b to contact the second gate electrode 114b, and a third wiring 166 on the interlayer insulation layer 161 of the electrode region B may be disposed.

According to the embodiment of the present invention, a doping region 137 below the bottom surface of the trench 120b contacts the base substrate 100. Unlike this, according to a modification of the embodiment of the present invention, a doping region may not contact the base substrate 100. This will be described with reference to FIG. 6.

Figure 6:
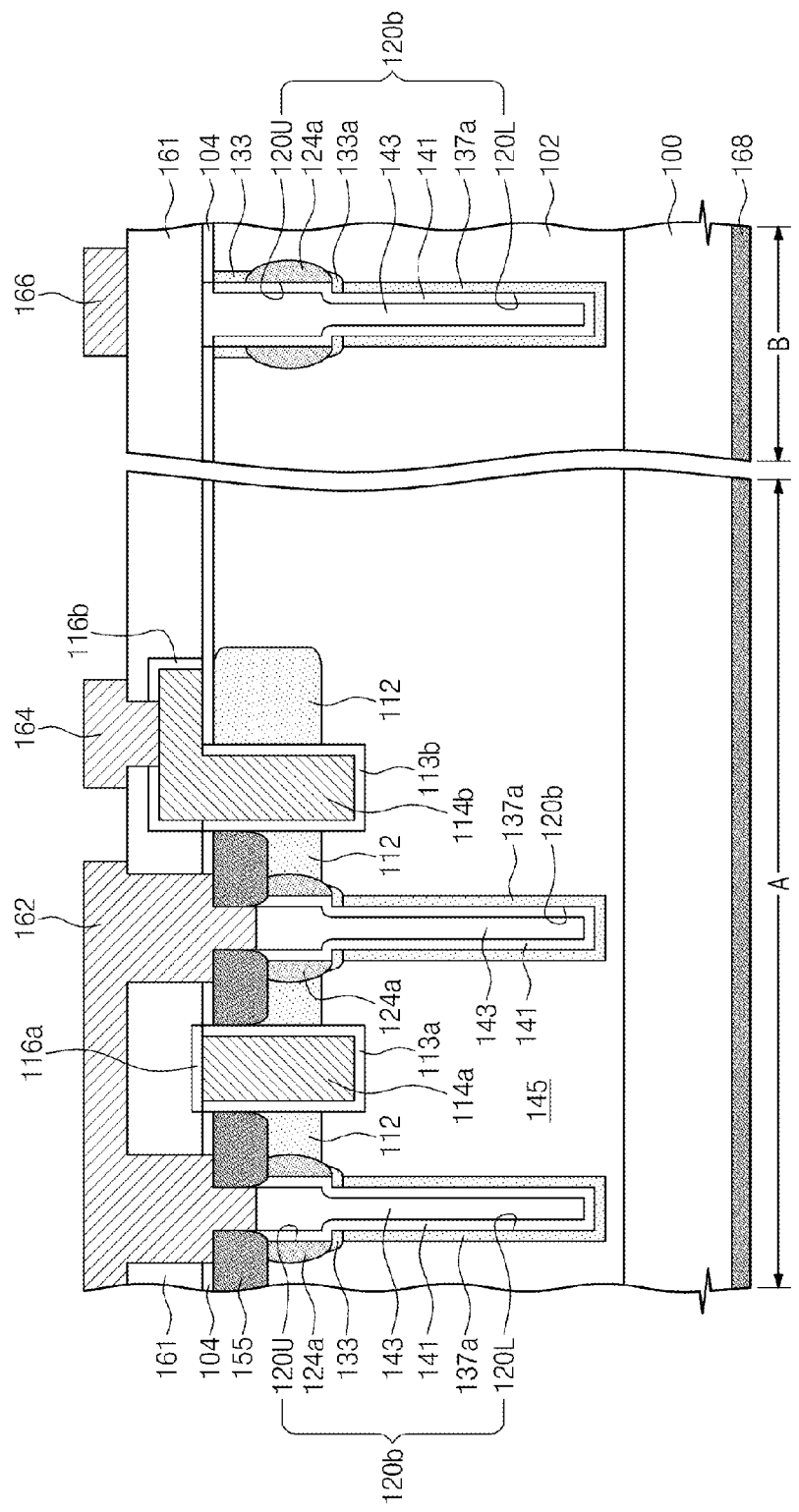
FIG. 6 is a view illustrating a semiconductor device according to a modification of the third embodiment of the present invention.

FIG. 6 is a view illustrating a semiconductor device according to a modification of the third embodiment of the present invention.

Referring to FIG. 6, the semiconductor device according to a modification of the third embodiment of the present invention is similar to that described with reference to FIG. 5F. However, a second doping region 137a below the bottom surface of a trench 120b may not contact the top surface of the base substrate 100. Thereby, a semiconductor pillar 145 and an epitaxial substrate 102 may contact each other.

According to an embodiment of the present invention, a trench dopant containing layer including a dopant of a second conductive type is formed on the sidewall and the bottom surface of a trench in a semiconductor substrate of a first conductive type and also the dopant in the trench dopant containing layer diffuses into the semiconductor substrate to form a doping region. Accordingly, a concentration of the second conductive dopant in the doping region is uniform so that a highly-reliable semiconductor device may be realized.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor device comprising:
   gap fill insulation patterns filling trenches in an epitaxial substrate;
   a semiconductor layer interposed between the gap fill insulation patterns and the trenches;
   a semiconductor pillar defined between the gap fill insulation patterns and doped with a dopant of a first conductive type;
   a gate electrode disposed in a recess region in the semiconductor pillar;
   a doping region disposed below the trenches and doped with a dopant of a second conductive type; and
   a body region disposed in the semiconductor pillar and surrounding a sidewall of the recess region,
   wherein the body region is doped with the second conductive type dopant;
   the semiconductor layer is not doped with the second conductive type dopant; and
   a width of an upper region of the trenches is broader than of a lower region of the trenches.

2. The semiconductor device of claim 1, wherein a sidewall of the trenches has a step-shaped structure.

3. The semiconductor device of claim 1, wherein the doping region comprises a first doping region adjacent to a boundary between the upper region and the lower region of the trenches and a second doping region except the first doping region; and
   a concentration of the second conductive type dopant of the first doping region is higher than that of the second doping region.

4. The semiconductor device of claim 1, wherein the epitaxial substrate is stacked on a base substrate and the doping region contacts the base substrate without a gap.

5. A semiconductor device comprising:
   gap fill insulation patterns filling trenches in an epitaxial substrate;

a semiconductor layer interposed between the gap fill insulation patterns and the trenches;
a semiconductor pillar defined between the gap fill insulation patterns and doped with a dopant of a first conductive type;
a gate electrode disposed in a recess region in the semiconductor pillar;
a doping region disposed below the trenches and doped with a dopant of a second conductive type; and
a body region disposed in the semiconductor pillar and surrounding a sidewall of the recess region,
wherein the body region is doped with the second conductive type dopant;
and the semiconductor layer is not doped with the second conductive type dopant.

6. The semiconductor device of claim 5, wherein the doping region comprises a first doping region adjacent to a boundary between the upper region and the lower region of the trenches and a second doping region except the first doping region; and
a concentration of the second conductive type dopant of the first doping region is higher than that of the second doping region.

7. The semiconductor device of claim 5, wherein the epitaxial substrate is stacked on a base substrate and the doping region contacts the base substrate without a gap.

8. A semiconductor device comprising:
gap fill insulation patterns filling trenches in an epitaxial substrate;
a semiconductor pillar defined between the gap fill insulation patterns and doped with a dopant of a first conductive type;
a gate electrode disposed in a recess region in the semiconductor pillar;
a doping region disposed below the trenches and doped with a dopant of a second conductive type; and
a body region disposed in the semiconductor pillar and surrounding a sidewall of the recess region,
wherein the body region is doped with the second conductive type dopant; and
the epitaxial substrate is stacked on a base substrate and the doping region contacts the base substrate without a gap.

9. The semiconductor device of claim 8, wherein the doping region comprises a first doping region adjacent to a boundary between the upper region and the lower region of the trenches and a second doping region except the first doping region; and
a concentration of the second conductive type dopant of the first doping region is higher than that of the second doping region.

* * * * *